(12) United States Patent
Schultz et al.

(10) Patent No.: US 6,429,682 B1
(45) Date of Patent: *Aug. 6, 2002

(54) CONFIGURATION BUS INTERFACE CIRCUIT FOR FPGAS

(75) Inventors: David P. Schultz; Lawrence C. Hung, both of San Jose; F. Erich Goetting, Cupertino, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/865,813

(22) Filed: May 25, 2001

Related U.S. Application Data

(63) Continuation of application No. 09/374,471, filed on Aug. 13, 1999, now Pat. No. 6,262,596.
(60) Provisional application No. 60/127,860, filed on Apr. 5, 1999.

(51) Int. Cl.[7] .......................................... H03K 19/173
(52) U.S. Cl. .............................. 326/41; 326/38; 326/39
(58) Field of Search ..................................... 326/37–41

(56) References Cited

U.S. PATENT DOCUMENTS

| | | | |
|---|---|---|---|
| 5,208,781 A | | 5/1993 | Matsushima |
| RE34,363 E | | 8/1993 | Freeman |
| 5,394,031 A | | 2/1995 | Britton et al. |
| 5,426,379 A | | 6/1995 | Trimberger |
| 5,430,687 A | | 7/1995 | Hung et al. |
| 5,457,408 A | | 10/1995 | Leung |
| 5,485,418 A | | 1/1996 | Hiraki et al. |
| 5,488,582 A | | 1/1996 | Camarota |
| 5,654,650 A | * | 8/1997 | Gissel .......................... 326/38 |
| 5,670,897 A | | 9/1997 | Kean |
| 5,726,584 A | | 3/1998 | Freidin |
| 5,773,993 A | | 6/1998 | Trimberger |
| 5,804,986 A | | 9/1998 | Jones |
| 5,838,165 A | * | 11/1998 | Chatter ......................... 326/38 |
| 5,870,410 A | | 2/1999 | Norman et al. |
| 5,970,240 A | | 10/1999 | Chen et al. |
| 5,977,791 A | | 11/1999 | Veenstra |
| 6,020,757 A | | 2/2000 | Jenkins, IV. |
| 6,026,465 A | | 2/2000 | Mills et al. |
| 6,091,263 A | | 7/2000 | New et al. |
| 6,097,211 A | | 8/2000 | Couts-Martin et al. |
| 6,097,988 A | | 8/2000 | Tobias |
| 6,104,208 A | | 8/2000 | Rangasayee |
| 6,107,821 A | | 8/2000 | Kelem et al. |
| 6,157,210 A | | 12/2000 | Zaveri et al. |

OTHER PUBLICATIONS

"Xilinx Programmable Gate Array Data Book", 1999, pp. 3–1 to 3–60, available from Xilinx, Inc., 2100 Logic Drive, San Jose, CA 95124.

Xilinx Application Note XAPP 151, Version 1.1 entitled Virtex Configuration Architecture Advanced User's Guide, published Jul. 27, 1999, available from Xilinx, Inc., 2100 Logic Drive, San Jose, CA 95124.

* cited by examiner

*Primary Examiner*—Michael Tokar
*Assistant Examiner*—Vibol Tan
(74) *Attorney, Agent, or Firm*—Patrick T. Bever; Lois D. Cartier

(57) ABSTRACT

A bus interface circuit for a programmable logic device (PLD) including an interface multiplexer connected between two or more external communication circuits and a configuration memory array. The interface multiplexer coordinates communication between a selected one of the external communication circuits and a packet processor. The packet processor interprets command/data information transmitted in a bit stream from the selected external communication circuit. In a default state, the interface multiplexer connects dual-purpose input/output pins of the PLD to the packet processor. In an alternative state, the interface multiplexer connects a JTAG interface circuit to the packet processor to facilitate configuration operations through the JTAG pins of the PLD.

13 Claims, 13 Drawing Sheets

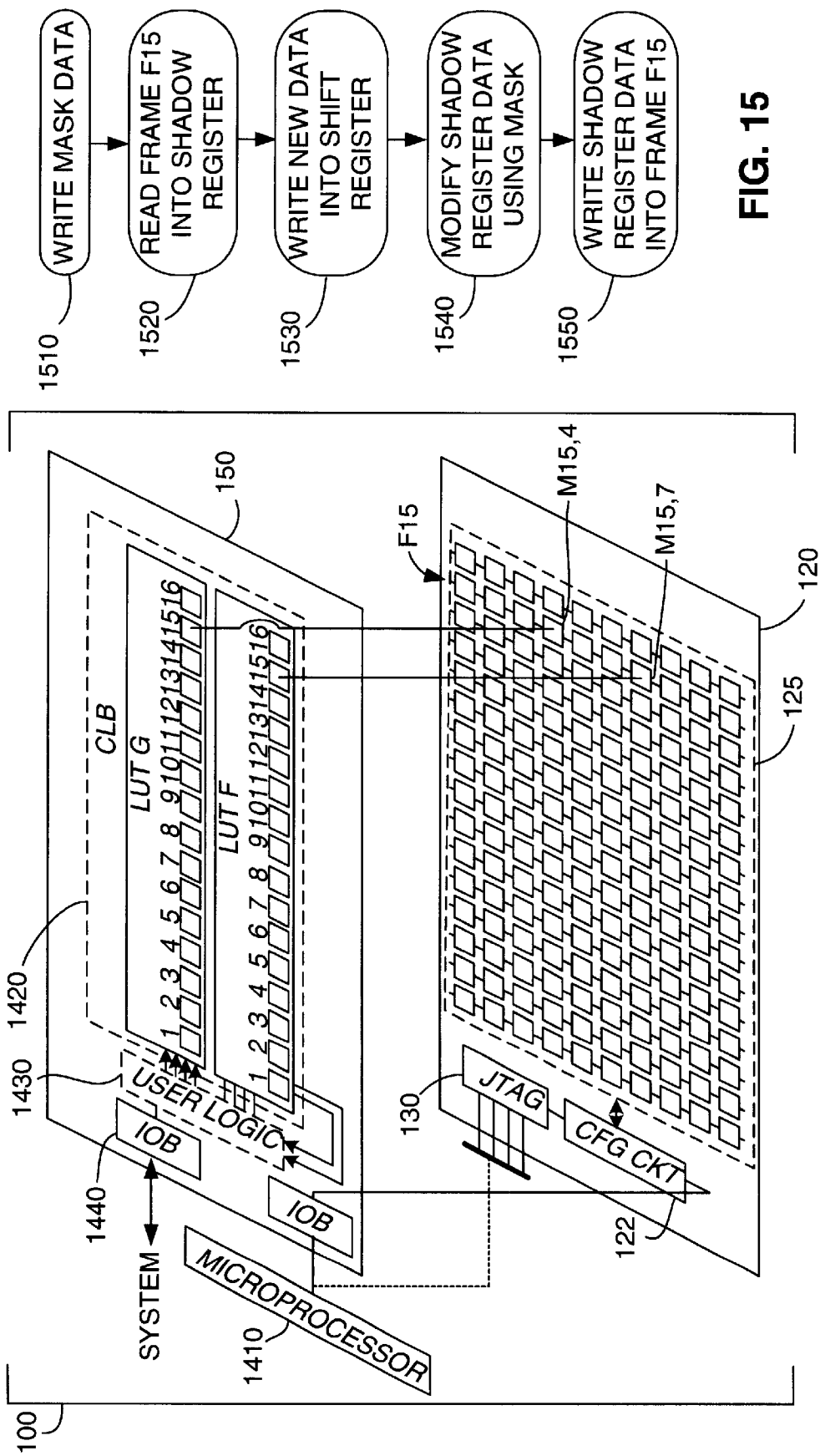

CONFIGURATION BUS INTERFACE CIRCUIT FOR FPGAS

CROSS-REFERENCE TO RELATED APPLICATIONS

This application is a continuation application of commonly assigned, patent application Ser. No. 09/374,471, now U.S. Pat. No. 6,262,596 entitled "CONFIGURATION BUS INTERFACE CIRCUIT FOR FPGAS," invented by David P. Schultz, Lawrence C. Hung, and F. Erich Goetting and filed Aug. 13, 1999;

which claims the benefit of provisional U.S. Patent Application No. 60/127,860, invented by David P. Schultz, Steven P. Young, Lawrence C. Hung, and F. Erich Goetting and filed Apr. 5, 1999, both of which are incorporated herein by reference.

FIELD OF THE INVENTION

The invention relates to field programmable gate arrays (FPGAs). The invention particularly relates to a structure and method for configuring static random access memory (SRAM)-based FPGAs.

BACKGROUND OF THE INVENTION

The first FPGA with programmable logic cells and programmable routing was described by Freeman in U.S. Pat. No. 4,870,302, reissued as U.S. Pat. No. Re. 34,363, which is incorporated herein by reference. An FPGA includes configurable logic blocks and configurable routing, which are programmed by configuration memory cells. The configuration memory cells are typically arranged in an array and are loaded with a bit stream of configuration data. The configuration data is selected to cause the FPGA to perform a desired function.

FIG. 1A shows a conventional array of configuration memory cells (i.e., a configuration memory array) such as that used by Xilinx, Inc., assignee of the present invention. The configuration memory array of FIG. 1A is a 16-bit by 16-bit array, which includes 256 configuration memory cells. In general, each of the configuration memory cells is identified by a reference character Mx,y, where x and y correspond to the row and column of the configuration memory cell. A typical array of configuration memory cells in a commercial device has on the order of 20,000 to one million memory cells. Therefore, the array of FIG. 1A is much smaller than is typically used in a commercial embodiment, but nevertheless shows the structure of prior art configuration memories.

To load data into the configuration memory array shown in FIG. 1A, the bit stream of configuration data is shifted through a data shift register DSR under control of a clocking mechanism until a frame of data (16 bits wide in this example) has been shifted into bit positions DS0 through DS15 of the data shift register DSR. This frame of data is then shifted in parallel on data lines D0 through D15 into a column of configuration memory cells addressed by address shift register ASR. The column is addressed by shifting a token high bit through the address shift register ASR from bit AS0 to bit AS15, one shift per frame. Each time a frame of configuration data is loaded through data shift register DSR, it is shifted in parallel to the column of memory cells selected by the token high bit. When the token high bit shifts out to the right, it activates a DONE circuit, which indicates that configuration is complete and causes the FPGA to become operational.

FIG. 1B is a simplified circuit diagram showing memory cell M0,0. Memory cell M0,0 includes a latch formed by inverters I1 and I2 that stores a bit value transmitted through a pass transistor T1. During configuration, when the token high bit is shifted into address shift register bit AS0 (FIG. 1A), the resulting high signal on line A0 is applied to the gate of pass transistor T1, thereby allowing the configuration bit stored in data shift register bit position DS0 to enter the latch via data line D0. The value stored in memory cell M0,0 is then applied via output line Q and/or Q-bar (QB) to control a corresponding configurable logic block or configurable-routing resource.

While the configuration circuitry described above is adequate for configuring the conventional configuration memory array shown in FIG. 1A, it is inadequate for performing more advanced operations. For example, the configuration circuitry does not support partial reconfiguration (i.e., changing only some of the configuration data without addressing all of the configuration memory cells) because there is no mechanism for addressing individual frames.

SUMMARY OF THE INVENTION

The present invention provides a novel configuration circuit and method for configuring a programmable logic device (PLD) that facilitates advanced configuration operations (such as partial reconfiguration) while minimizing the number of device pins needed to control these operations.

The present invention is utilized in a PLD that includes configurable logic blocks (CLBs) connected by configurable interconnect resources, and a configuration circuit that includes memory cells coupled to the configurable logic blocks and the configurable interconnect resources. The PLD also includes one or more external communication circuits for transmitting a configuration bit stream between external devices and the memory cells. Configuration data in the bit stream is transmitted to the memory cells of the configuration memory circuit during a configuration operation. During subsequent normal operation of the PLD, the configuration data stored in the memory cells determines the logic function performed by the CLBs.

In accordance with an aspect of the present invention, the configuration memory circuit includes an internal, bi-directional bus, a bus interface circuit connected between the bus and one or more external communication circuits, and a plurality of configuration registers connected between the bus and the configuration memory array. During configuration operations, the bus interface circuit decodes a header word from the configuration bit stream, parses the header word to identify an address field, and enables a selected configuration register to receive a subsequent (second) word or words from the bit stream when the address field matches an address assigned to the selected configuration register. The second word transmitted to the selected configuration register may include, for example, a command word for causing the selected configuration register to perform a predetermined operation, an address identifying a portion of the configuration memory array for reconfiguration, or data to be written to the configuration memory array. Because address and command information, as well as configuration data, is transmitted into the PLD via the bit stream, the number of device pins required to provide a wide variety of advanced configuration operations is minimized.

In accordance with another aspect of the present invention, the bus interface circuit includes a multiplexer (switch) for passing a configuration bit stream between a selected external communication circuit and the configuration memory array. For example, configuration data is selectively written to or read from the configuration memory array through a JTAG circuit, or through bi-directional pins of the FPGA. Access to the configuration memory is possible through the JTAG circuit while a user's logic function is being executed by the CLBs and IOBs of the FPGA. Alternatively, access through the bi-directional pins is possible if these pins are not needed to implement the user's logic function. Therefore, specialized operations that read and/or write configuration data during execution of the user's logic function are possible.

In accordance with another aspect of the present invention, a cyclic redundancy check (CRC) register is connected to the bi-directional bus and to the packet processor. The CRC register performs transmission error detection functions based on the command/data transmissions to various registers connected to the bus, and based on the address information transmitted from the packet processor to the address/operand decoder, thereby detecting both errors in the data transmitted to a selected register, and errors in the destination of the data.

In accordance with another aspect of the present invention, a frame mask register is provided in the configuration memory that controls which memory cells of each frame (column) are written during a configuration operation, thereby allowing selective access to individual groups of configuration data stored in the memory array.

BRIEF DESCRIPTION OF THE DRAWINGS

FIG. 14 is a simplified diagram illustrating a "read-modify-write" operation example that is directed to the FPGA shown in FIG. 2A.

FIG. 15 is a flow diagram showing process steps performed during a read-modify-write operation.

DETAILED DESCRIPTION OF THE DRAWINGS

The present invention is directed to a configuration architecture for programmable logic devices (PLDs), and is described with reference to field programmable gate arrays (FPGAs). Although the circuit structures and layout arrangements of the present invention are described below with particular reference to the Virtex™ family of FPGAs produced by Xilinx, Inc., of San Jose, Calif., some or all of the various aspects of the present invention may be beneficially utilized in other types of PLDs. Therefore, the appended claims should not necessarily be limited to FPGAs.

Virtex Overview: Logic and Configuration Planes

Figure 1A:
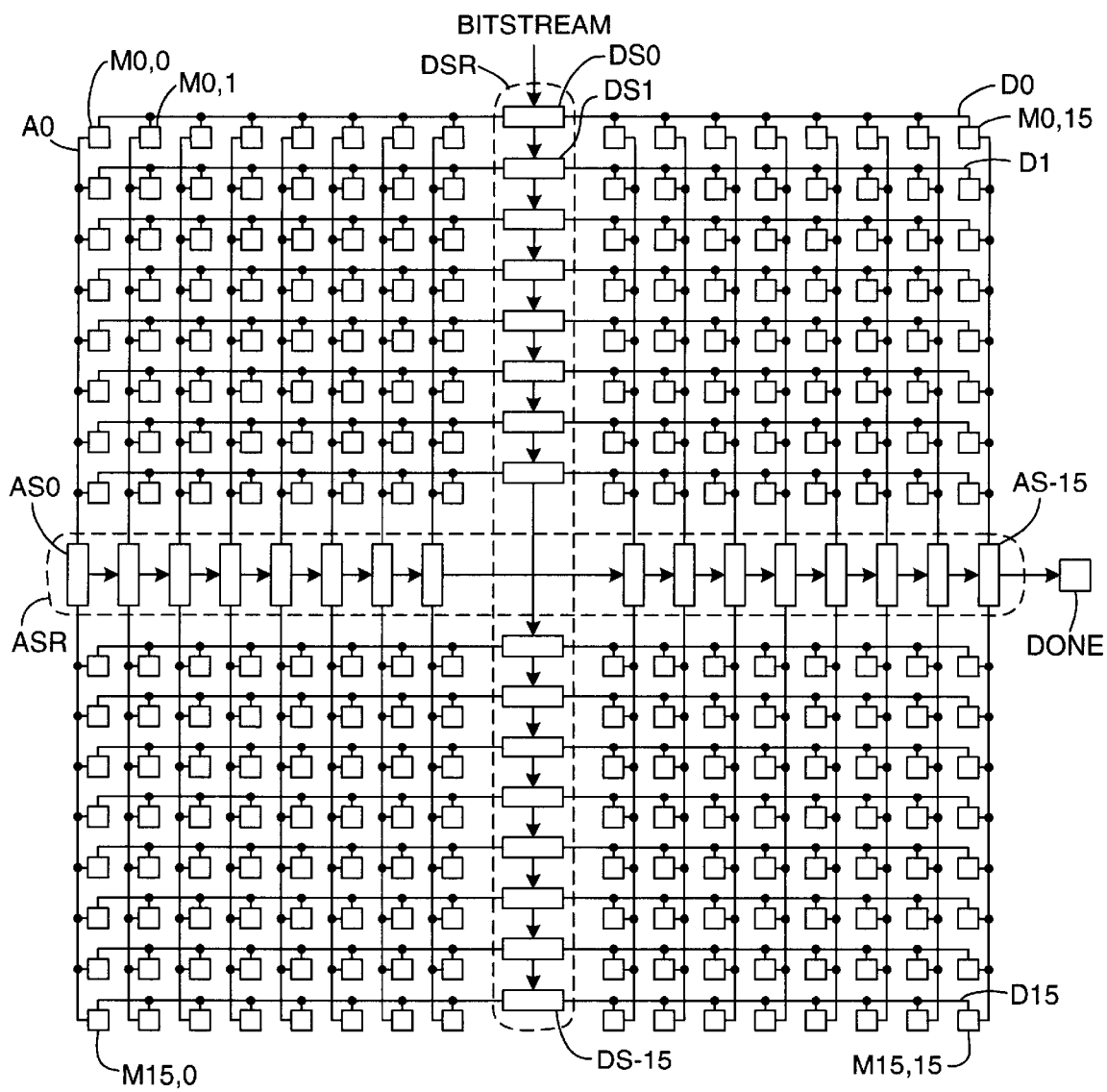
FIGS 1A and 1B are simplified circuit diagrams showing a prior art configuration memory array with a prior art address shift register.
Figure 1B:
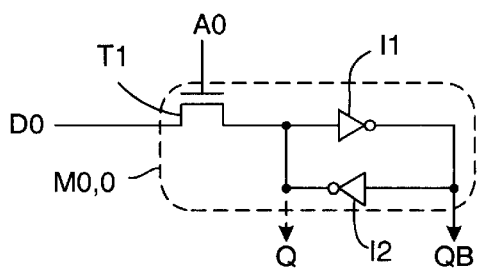
Figure 2A:
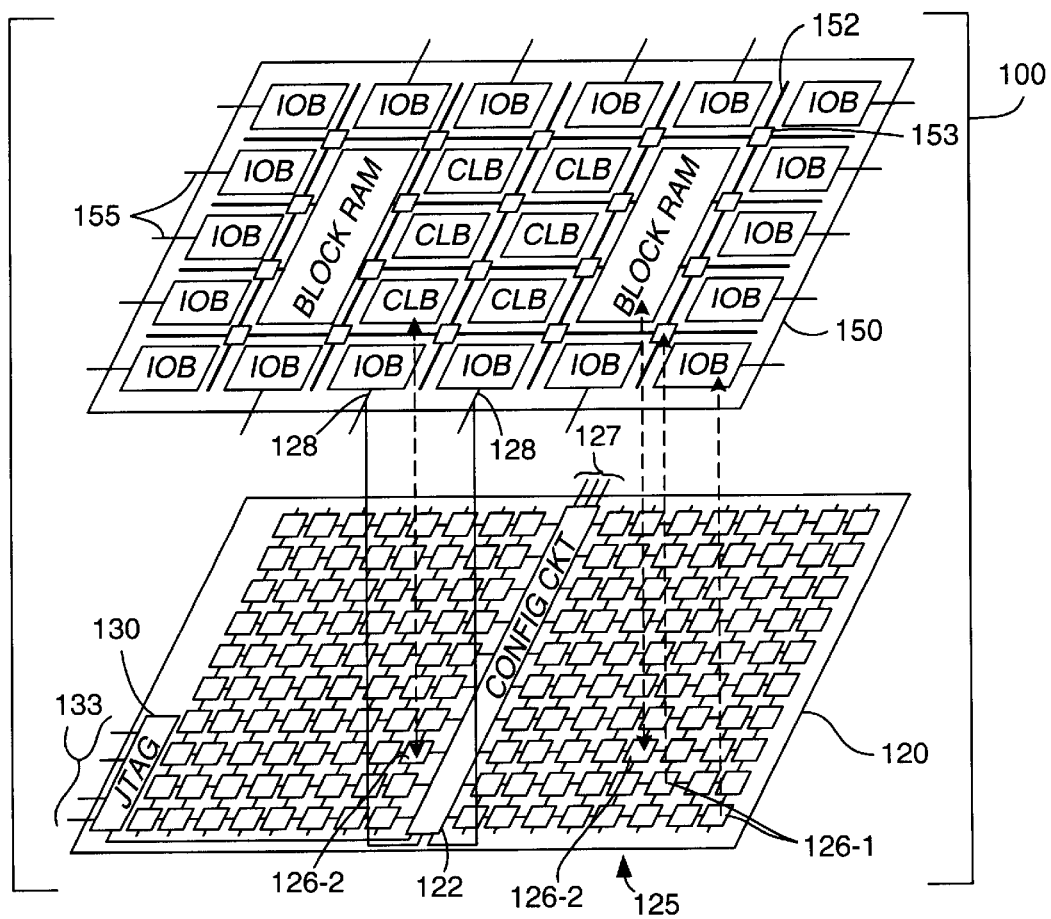
FIG. 2A is a simplified diagram illustrating an FPGA in accordance with one embodiment of the present invention that is functionally separated into a logic plane and a configuration plane.

FIG. 2A is a split-level perspective view showing a simplified representation of a Virtex FPGA 100. Similar to most integrated circuits, FPGA 100 includes programmable circuitry formed on a semiconductor substrate that is housed in a package having externally accessible pins. However, to simplify the following description, FPGA 100 is functionally separated into a configuration plane 120 and a logic plane 150. Other simplifications and functional representations are utilized to facilitate the following description. For additional detail regarding Virtex™ FPGAs, the reader is referred to the Xilinx Programmable Logic Data Book 1999, pages 3-1 through 3-60, which are incorporated herein by reference.

Configuration plane 120 generally includes a configuration circuit 122 and configuration memory array 125. Configuration circuit 122 includes several input and/or output terminals that are connected to dedicated configuration pins 127 and to dual-purpose input/output (I/O) pins 128. Configuration memory array 125 includes memory cells 126-1 and 126-2 that are arranged in "frames" (i.e., columns of memory cells extending the length of FPGA 100), and addressing circuitry (not shown) for accessing each frame. JTAG (Boundary Scan) circuitry 130 is included in configuration plane 120, and is also connected to at least one terminal of configuration circuit 122. JTAG circuit 130 includes the four well-known JTAG terminals 133 (i.e., TDI, TDO, TMS, and TCK). During configuration of FPGA 100, configuration control signals are transmitted from dedicated configuration pins 127 to configuration circuit 122. In addition, a configuration bit stream is transmitted from either the TDI terminal of JTAG circuit 130, or from dual-purpose I/O pins 128 to configuration circuit 122. During a configuration operation, circuit 122 routes configuration data from the bit stream to memory array 125 to establish an operating state of FPGA 100. Circuit 122 is described in additional detail below.

Programmable logic plane 150 includes CLBs arranged in rows and columns, IOBs surrounding the CLBS, and programmable interconnect resources including interconnect lines 152 (indicated by heavy black lines) and multi-way switch boxes 153 (indicated by rectangles) that are connected between the rows and columns of CLBs. During normal operation of FPGA 100, logic signals are transmitted from dual-purpose pins 128 and/or device I/O pins 155 through the IOBs to the interconnect resources, which route these signals to the CLBs in accordance with the configuration data stored in memory array 125. The CLBs perform logic operations on these signals in accordance with the configuration data stored in memory array 125, and transmit the results of these logic operations to dual-purpose pins 128 and/or device I/O pins 155. In addition to the CLBs, programmable logic plane 150 includes dedicated random-access memory blocks (BLOCK RAM) that are selectively accessed through the IOBs and interconnect resources. Other programmable logic plane resources, such as clock resources, are omitted from FIG. 2A for brevity.

Figure 2B:
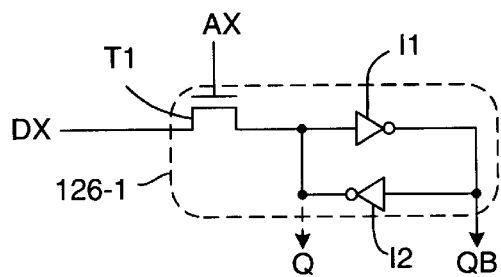
FIGS. 2B and 2C are simplified circuit diagrams showing configuration memory cells utilized in the configuration plane of the FPGA shown in FIG. 2A.
Figure 2C:
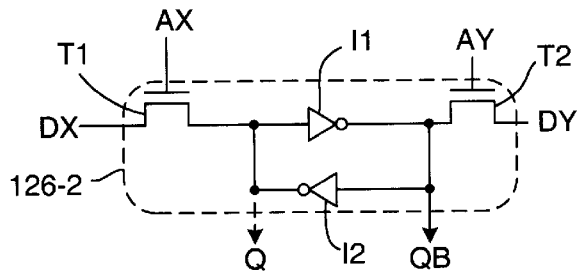

FIGS. 2B and 2C are simplified circuit diagrams illustrating the two types of memory cells utilized in FPGA 100: single-access memory cells 126-1 (FIG. 2B), and dual-access memory cells 126-2 (FIG. 2C). Single-access memory cells 126-1 are only accessible through configuration plane 120, while dual-access memory cells 126-2 are accessible through both configuration plane 120 and logic plane 150.

Referring to FIG. 2B, memory cell 126-1 includes a latch formed by inverters I1 and I2 that can only be programmed with data transmitted on configuration data line DX via transistor T1, which is controlled by a configuration address signal transmitted on configuration address line AX. The values stored in memory cells 126-1 are used to control portions of FPGA 100 that typically do not change during normal (logic) operation. For example, as indicated by the single-headed dashed-line arrows in FIG. 2A, memory cells 126-1 are used to control the IOBs and the interconnect resources to form signal routing paths between selected CLBS. After memory cells 126-1 are set during initial configuration, they may only be changed or otherwise accessed (i.e., read or written) through configuration circuit 122 during readback or reconfiguration operations.

Referring to FIG. 2C, each dual-access memory cell 126-2 includes a latch that can be programmed with data transmitted through either configuration plane 120 or logic plane 150. Similar to single-access memory cells 126-1, dual-access memory cell 126-2 is programmed during the configuration mode using data received on configuration data line DX via transistor T1, which is turned on by configuration address line AX. During normal operation, dual-access memory cell 126-2 may be reprogrammed with data received at terminal DY via transistor T2, which is controlled by an address signal received at terminal AY. These normal operation data signals and address signals are received from the interconnect resources of FPGA 100 in accordance with a user's logic operation. The values stored in dual-access memory cells 126-2 are used to control portions of FPGA 100 that may change during normal (logic) operation, such as the lookup table data in the CLBs and memory data in the Block RAMs. As indicated by the dual-headed dashed-line arrows in FIG. 2A, after memory cells 126-2 are set during initial configuration, they may be changed or otherwise accessed (i.e., read or written) through the interconnect resources of logic plane 150, and they may be read back or reconfigured via configuration plane 120 (as discussed below).

Figure 3A:
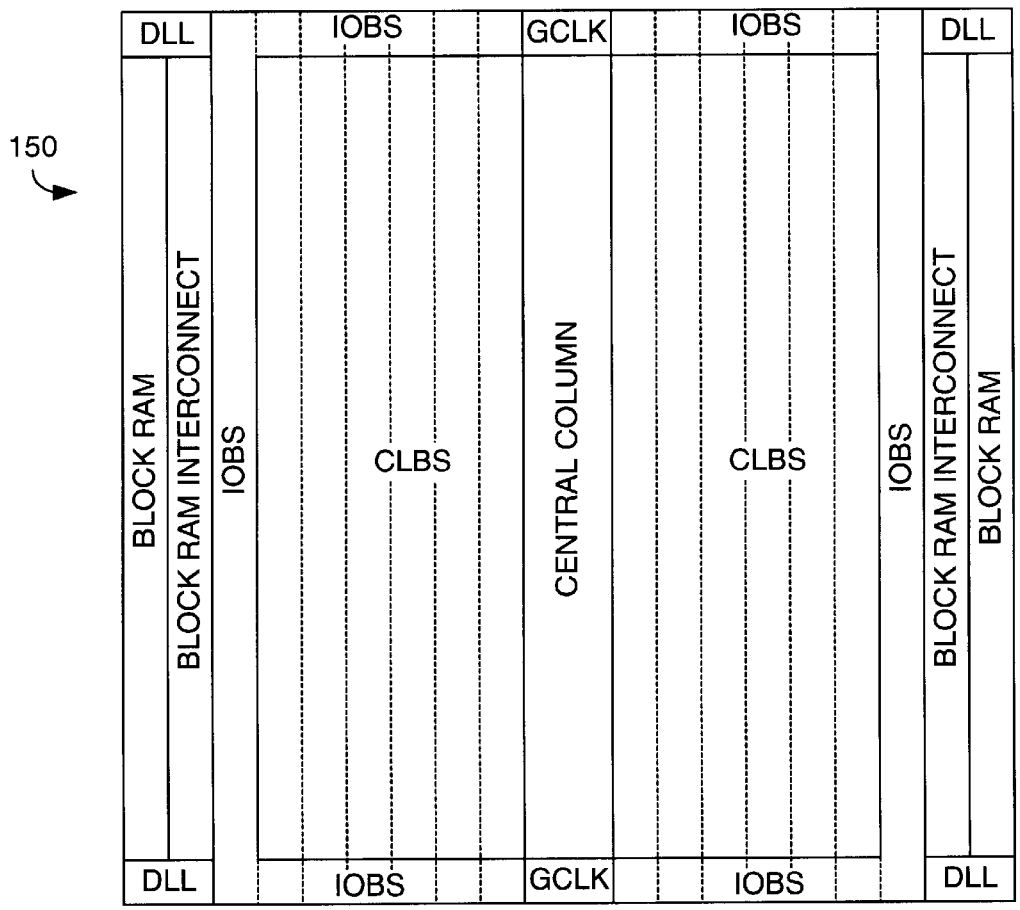
FIGS. 3A and 3B are simplified diagrams illustrating the arrangement of logic resources and corresponding configuration memory frames of the FPGA shown in FIG. 2A.

FIG. 3A is a plan view showing additional detail regarding the arrangement of the CLBs, IOBs, and Block RAMs in logic plane 150 of Virtex FPGA 100 (see FIG. 2A). The CLBs, IOBs and Block RAMs of logic plane 150 are organized as rectangular arrays on opposing sides of a central column, which includes global clock circuitry (GCLK) and portions of configuration circuit 122 (shown in FIG. 2A). The CLBs, IOBs and Block RAMs are organized into columns to facilitate configuration. For convenience, the interconnect resources are considered part of the CLB columns, and are therefore not shown in FIG. 3A. Each CLB column includes two IOBs at its upper end and two IOBs at its lower end. IOB columns are located on the left and right sides of the CLB columns. On the left and right edges of the IOB columns are Block RAM columns and Block RAM interconnect columns, each including delay-lock loop (DLL) circuitry at respective upper and lower ends. Global clock (GCLK) circuitry is provided at the upper and lower ends of the central column.

Figure 3B:
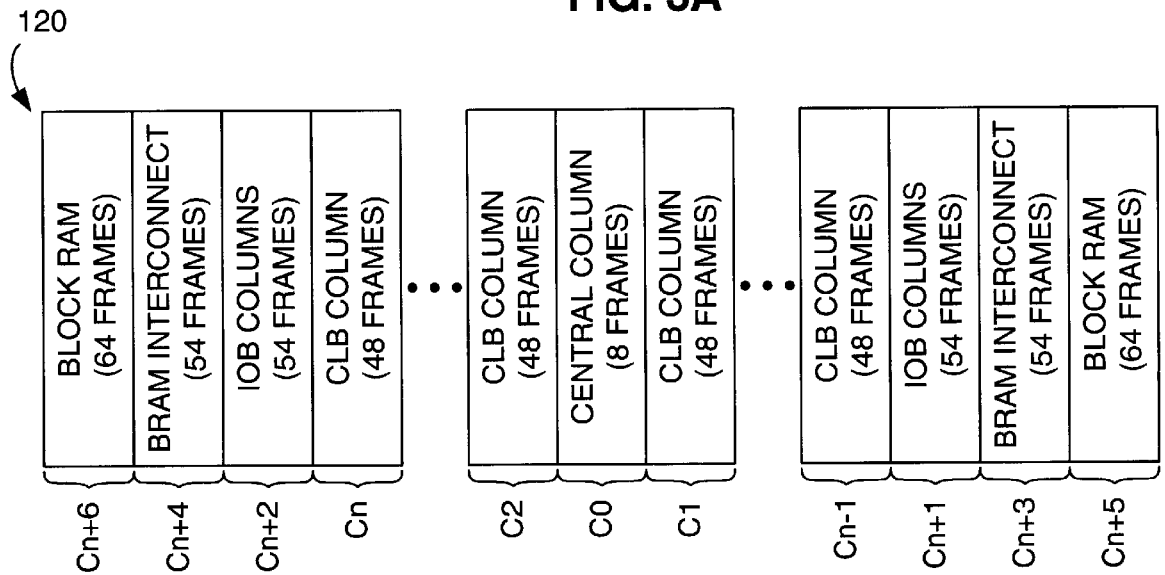

Configuration memory cells 126-1 and 126-2 of configuration plane 120 are arranged in vertical frames that extend the length (i.e., top to bottom) of the CLB, IOB, Block RAM and central columns of FPGA 100. Multiple frames control each CLB, IOB, Block RAM, and central column of FPGA 100. For example, FIG. 3B illustrates the numbers of frames associated with the CLB, IOB, Block RAM, Block RAM interconnect and central columns of a Virtex FPGA. Each CLB column includes 48 frames, each IOB column includes 54 frames, each Block RAM column includes 64 frames, each Block RAM interconnect column includes 54 frames, and the central column includes 8 frames. Of course, the number of frames in each column may differ from the numbers indicated in FIG. 3B.

Each frame of configuration memory cells is addressed by a major address and a minor address. The major address indicates the column in which the frame is located, and the minor address indicates the frame associated with each major address. As indicated in FIG. 3B, the major addresses for the frames in Virtex FPGAs alternate between the left and right sides of the chip. For example, major address C0 (which is associated with the central column) is located in the center of the chip. Major address C1 references the CLB column that lies to the right of the central column, major address C2 references the CLB column that lies to the left the central column, and so on, until the IOB and Block RAM columns Cn+1 to Cn+6. The minor address identifies a particular frame within a major address. As set forth in detail below, by addressing each frame individually it is possible to read or write (i.e., configure) multiple consecutive frames with a single configuration command by designating a starting frame and reading/writing consecutive frames in an ascending or descending order, thereby facilitating partial reconfiguration. Further, an individual frame can be read or written with a single command, thereby facilitating the use of semaphores, which are described below. Moreover, by storing, for example, the frame addresses for all CLBs of FPGA 100, it is possible to reconfigure all of the CLBs using a single command (i.e., without addressing the CLB frames individually, and without addressing the frames associated with the IOBs, interconnect resources, and Block RAMs).

The size (i.e., number of memory cells) of each frame depends, for example, on the number of CLB rows of a particular FPGA. In one embodiment, the number of configuration memory cells in each CLB frame is calculated by multiplying the number of CLB rows by the number of memory cells in each row (e.g., 18), and then adding two additional sets of memory cells for the IOBs located above and below the CLBs. The sequence of bits in each frame is arranged in a consistent manner. For example, the first 18 bits of a CLB frame control the two IOBs at the top of the column, then 18 bits are allocated for each CLB row, until finally, the last 18 bits control the two IOBs at the bottom of the CLB column. As discussed below, the bits written to each frame are padded with zeroes such that each frame receives 32n configuration bits, where n is an integer. In accordance with an embodiment of the present invention, an additional padding word is needed at the end of each frame for pipelining. When reading and writing frames, bits are grouped into 32-bit words, starting on the left (corresponding to the top of the chip). If the last word does not completely fill a 32-bit word, it is padded on the right with zeroes.

In accordance with an aspect of the present invention, relative locations of dual-access memory cells 126-2 (see FIG. 2C) within each frame are the same for every CLB and Block RAM column. In one embodiment, dual-access bits 126-2 associated with 16-bit LUTs in each CLB are distributed across 16 consecutive frames. Therefore, 16 consecutive frames contain all 16 bits of the 16-bit LUT for a column of CLB slices. Therefore, it is necessary to read/write the 16 frames containing those bits in order to read/write the sixteen bits of a particular LUT. Conversely, each frame includes all bits assigned to the first memory location of each LUT of the CLB column. Therefore, to read the first bit of several LUTs in a column, it is only necessary to read one frame. In other embodiments, all sixteen bits of each LUT may be incorporated into a single frame. As discussed below, by arranging the dual access bits 126-2 in a consistent manner, it is possible to locate a particular dual-purpose memory cell 126-2 using a predetermined equation, thereby facilitating the use of semaphores.

Configuration Bus

In accordance with another aspect of the present invention, configuration circuit 122 includes a configuration bus that allows an external source to have complete control over a wide range of configuration functions in FPGA 100 using a bit stream transmitted through one or more I/O pins. These configuration functions are initiated by accessing and loading addressed internal configuration registers that are connected to the configuration bus. As discussed in detail below, some of the internal configuration registers are responsive to command words and/or control data to set configuration parameters and perform predefined operations. Other registers are utilized to pass configuration data between the I/O pins and configuration memory array 125. All command, control and configuration data, except for certain "pad" words (e.g., synchronization and dummy words, described below), is directed to one or more selected registers using address information provided in header words that precede the data in the bit stream. Therefore, the configuration bus structure facilitates accessing and a wide variety of advanced configuration operations while minimizing the number of device pins needed to control these configuration operations.

Figure 4:
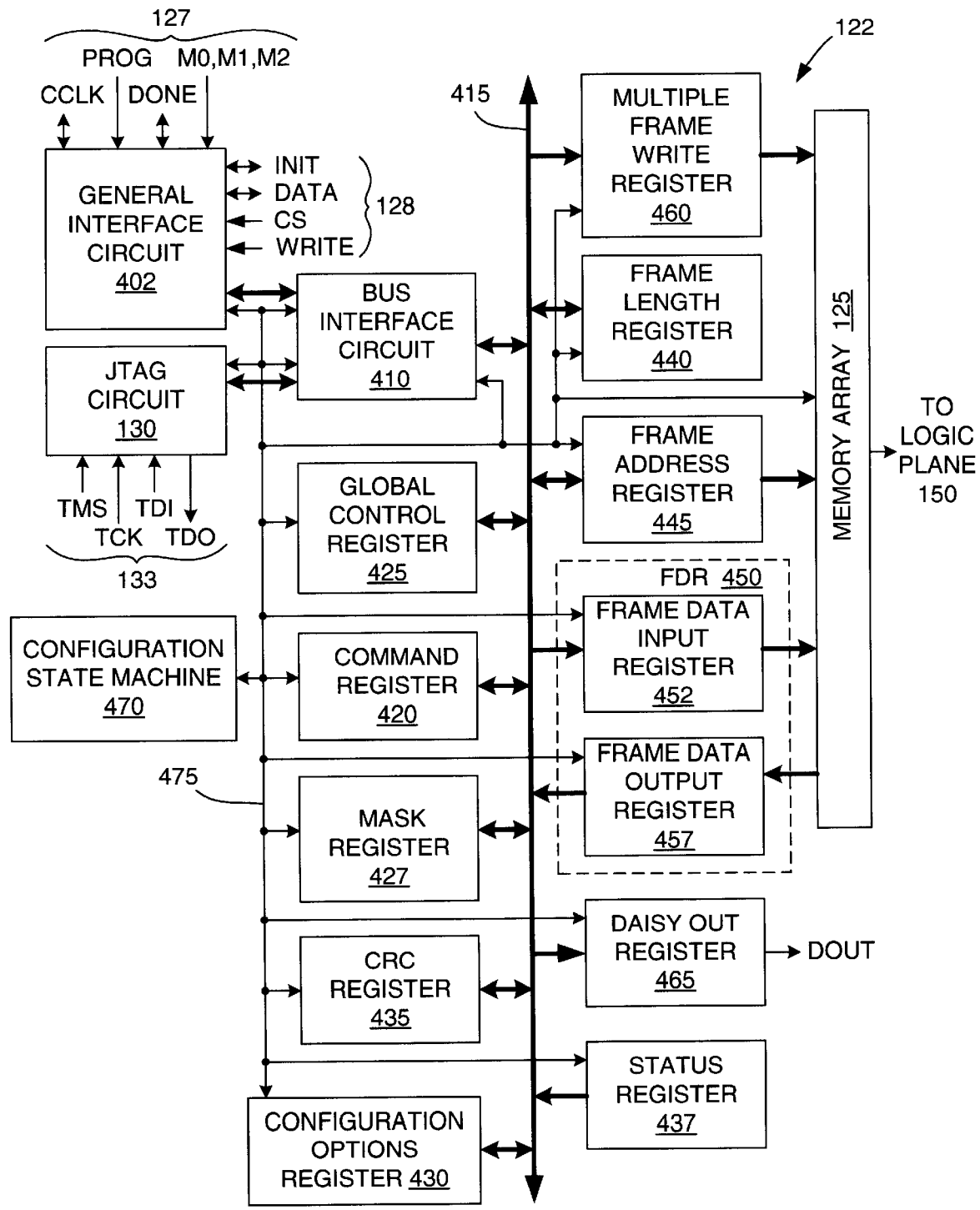
FIG. 4 is a block diagram showing a configuration circuit of the FPGA shown in FIG. 2A.

FIG. 4 is a block diagram showing a configuration circuit 122 that includes a configuration bus structure according to an embodiment of the present invention. Configuration circuit 122 includes a collection of 32-bit registers (referred to herein as the configuration registers) for accessing and controlling the configuration logic of configuration plane 120. These configuration registers are accessed through JTAG circuit 130 and/or a general interface circuit 402 that are respectively connected to a bus interface circuit 410. Bus interface circuit 410 is connected between general interface circuit 402 and a common 32-line parallel bus 415. The configuration registers are also connected to bus 415 and include a command register 420, a global control register 425, a mask register 427, a configuration options register 430, a cyclic redundancy check (CRC) register 435, a status register 437, a frame length register 440, a frame address register 445, a frame data register (FDR) 450, a multiple frame write register 460, and a daisy out register 465. In one embodiment, FDR 450 includes both a frame data input register 452 and a frame data output register 457. A configuration state machine 470 is provided to coordinate the configuration registers and memory array 125 during the configuration and readback operations. Communication between the interface circuits, configuration registers, configuration state machine 470, and memory array 125 is carried out over a conductive network 475. Details and functions of configuration circuit 122 are described in the following paragraphs.

General Interface Circuit

There are two interface circuits provided on FPGA 100: one is provided by JTAG circuit 130, the other by general interface circuit 402. Additional interface circuits may be incorporated onto FPGA 100 to provide additional paths for communicating with configuration memory array 125.

JTAG circuit 130 is substantially defined by IEEE Standard 1149.1, which is well known. This standard includes provisions for special-purpose Boundary-Scan registers that perform functions such as in-system programming (ISP). JTAG circuit 130 includes such a special-purpose register (not shown) that performs the data processing functions described below with respect to general interface circuit 402. In particular, this special-purpose register is responsive to command, clock and data signals transmitted on JTAG pins 133 (TDI, TDO, TCK, and TMS) to transmit data signals to and receive signals from bus interface circuit 410. Note that when JTAG circuit 130 is utilized for configuration and readback operations, dual-purpose pins 128 (INIT, DATA, CS, and WRITE) are not utilized by general interface circuit 402. However, dedicated pins 127 (CCLK, PROG, DONE, M0, M1, M2) pass their respective control signals to configuration circuit 122 when configuration/readback operations are performed through either JTAG circuit 130 or dual-purpose pins 128 of general interface circuit 402.

In one embodiment, general interface circuit 402 includes a 32-bit shift register and control circuitry for coordinating data transmissions between dual-purpose pins 128 and bus interface circuit 410. During configuration operations, one DATA terminal is utilized for serial bit stream transmissions. Alternatively, eight DATA terminals are utilized for 8-bit parallel bit stream transmissions, and so forth. During configuration operations, upon receiving each 32-bit word of the bit stream, general interface circuit 402 transmits a write (WR) signal to bus interface circuit 410, and then transmits the 32-bit word in parallel to bus interface circuit 410 upon receiving authorization. This data transmission process is described in further detail below.

Bus Interface Circuit

Figure 5:
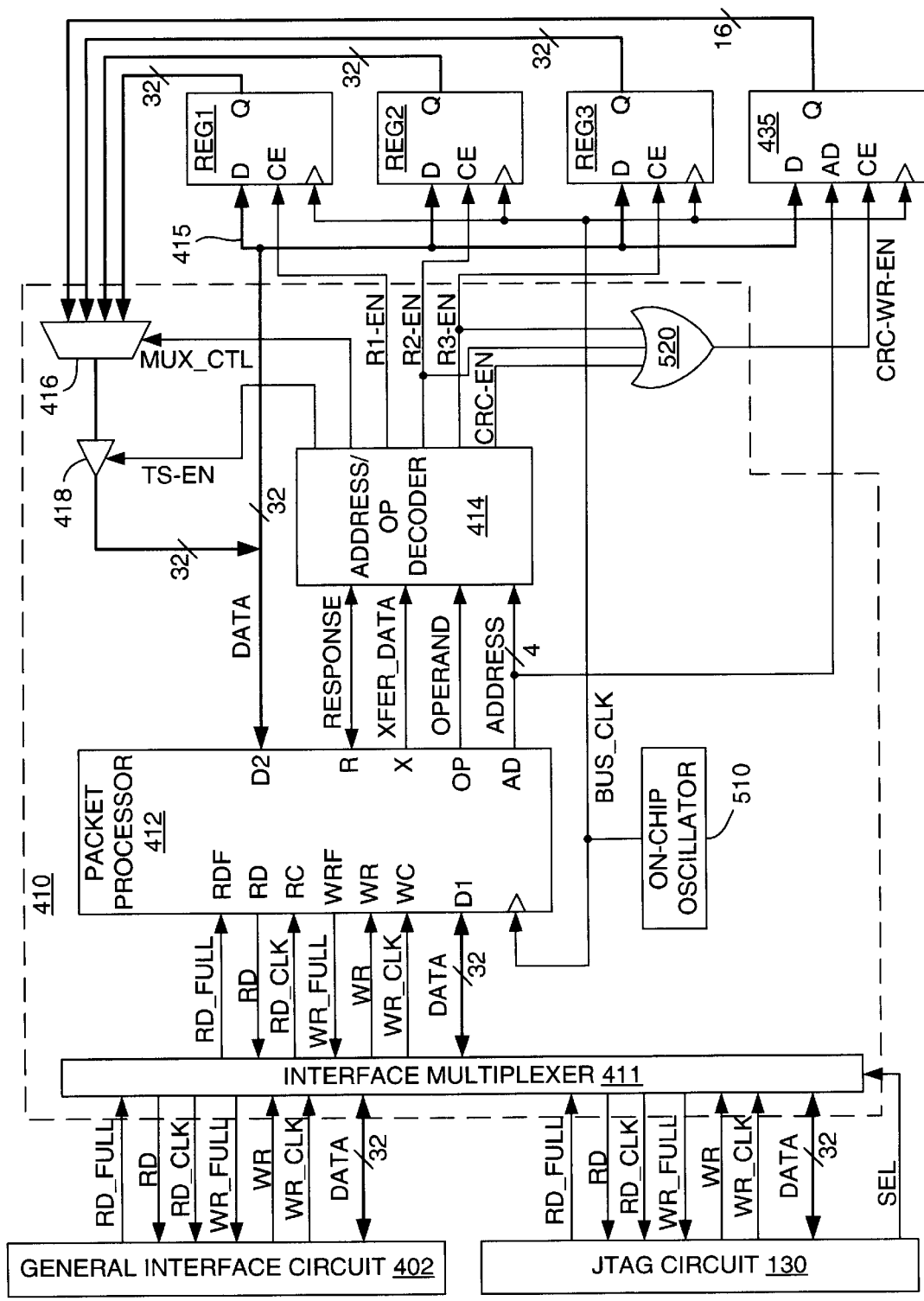
FIG. 5 is a block diagram showing an interface circuit of the configuration circuit shown in FIG. 4.

FIG. 5 is a simplified block diagram showing bus interface circuit 410. Bus interface circuit 410 includes an interface multiplexer 411, a packet processor 412, an address/operand (ADDRESS/OP) decoder 414, a read multiplexer 416 and a tri-state buffer 418.

Interface multiplexer 411 coordinates communications between bus interface circuit 410 and one of the external communication circuits (e.g., general interface circuit 402 and JTAG circuit 130). In a default state, interface multiplexer 411 connects general interface circuit 402 to packet processor 412. Alternatively, JTAG circuit 130 generates a select (SEL) signal that controls interface multiplexer 411 to connect JTAG circuit 130 to packet processor 412. Additional interface circuits may be provided by modifying interface multiplexer 411 using known techniques. Because JTAG circuit 130 is connectable to bus interface circuit 410, access to configuration memory 125 is possible while logic plane 150 is operating (i.e., executing a user's logic function). Therefore, specialized operations that read and/or write configuration data during execution of the user's logic function are possible. Further, access to configuration memory 125 may be obtained during execution of the user's logic function through general interface circuit 402 when dual-purpose pins 128 are not needed for performing the user's logic function. Therefore, interface multiplexer 411 greatly enhances the functionality of FPGA 100 by allowing access to configuration memory 125 through one or more persistent external communication circuits.

Packet processor 412 includes a first data terminal D1 connected by a 32-bit parallel bus (DATA) to general interface circuit 402 or JTAG circuit 130 via interface multiplexer 411. Packet processor 412 also includes control terminals WR (write), WC (write clock), WRF (write register full), RD (read), RC (read clock), and RDF (read register full) for communicating with general interface circuit 402 or JTAG circuit 130. A bus clock terminal (indicated by a triangle in FIG. 5) is also provided for receiving a BUS_CLK signal from an on-chip oscillator 510. Packet processor 412 includes a register (not shown) for storing a header word from the bit stream received at data terminal D1. Packet processor 412 parses the header word to identify address, operand and word count fields, and passes the address and operand field content to address/operand decoder 414 via terminals OP (operand) and AD (address). Packet processor 412 is also connected to bus 415 via a second data terminal D2, and to address/operand decoder 414 via control terminals R and X, through which response and transfer-data (XFER_DATA) control signals are transferred to and from address/operand decoder 414.

Address/operand decoder 414 decodes the address and operand data received from packet processor 412, and generates register enable signals (e.g., R1-EN, R2-EN, and R3-EN) and read control signals (e.g., multiplexer control signals MUX_CTL and tri-state enable signal TS-EN) in response to the transfer-data and response control signals. The register enable signals are used to enable a selected configuration register (identified as REG1, REG2 and REG3 for convenience) to receive a subsequently transmitted (second) 32-bit word from the bit stream that is transmitted onto bus 415 from packet processor 412. The multiplexer control signal MUX_CTL is utilized to control read multiplexer 416 to pass the contents of the selected configuration register to tri-state buffer 418, which in turn is controlled by tri-state enable signal TS-EN to apply the register contents to data terminal D2 of packet processor 412.

In accordance with an aspect of the present invention, bus interface circuit 410 writes a data word to a selected configuration register by generating a corresponding register enable signal in response to the register address field transmitted in the header word of the bit stream. For example, a data word is written to register REG1 when the address field in the preceding header word matches an address previously assigned to register REG1, and the operand field in the header word indicates a write operation. Under these conditions, address/operand decoder 414 generates a high R1-EN signal (the R2-EN and R3-EN signals remain low), and a low TS-EN signal, thereby disabling tri-state buffer 418. Packet processor 412 then passes the data (second) word to bus 415. Configuration register REG1, which is enabled by the high R1-EN signal, receives and stores the data word from bus 415. Registers REG2 and REG3 do not store the data word because of the low R2-EN and R3-EN signals.

Bus interface circuit 410 reads a data word from a selected configuration register by first writing a header word to packet processor 412 that includes the address of the selected configuration register in the address field and a read command in the operand field. In response, address/operand decoder 414 transmits a register enable signal to the selected register, an appropriate multiplexer control signal to read multiplexer 416, and a tri-state enable signal to tri-state buffer 418. In response to the register enable signal, the selected register transmits its contents via-the Q output terminal to read multiplexer 416, which passes the 32-bit word through tri-state buffer 418 to the D2 terminal of package processor 412. Other read operation examples are provided below.

Figure 6:
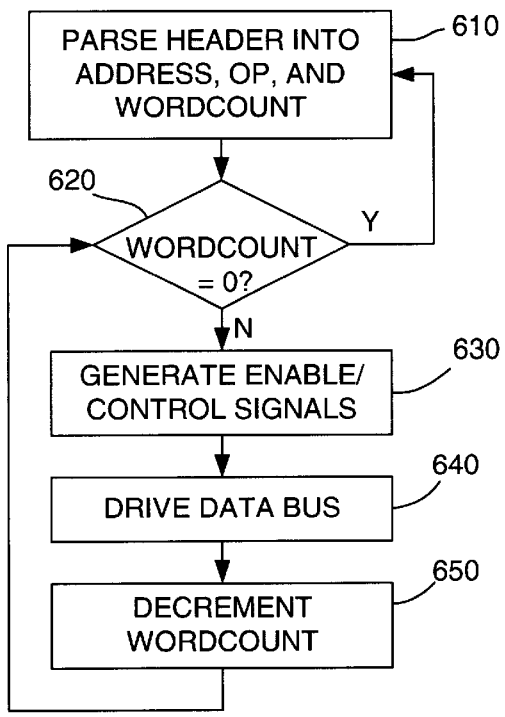
FIG. 6 is a flow diagram showing process steps performed by the interface circuit of FIG. 5.

FIG. 6 is a flow diagram illustrating the basic operation of bus interface circuit 410. The header word of a bit stream is stored in packet processor 412, and the header word is parsed into address, operand (OP) and word-count fields (Step 610). The word count value is stored in packet processor 412, and is used to control the number of data words subsequently passed to or received from the configuration registers (Step 620). While a non-zero word-count value is present in package processor 412, register enable signals (e.g., R1-EN) and read/write control signals (e.g., TS-EN) are generated in accordance with the desired operation (Step 630). After generating the appropriate register enable and read/write control signals, a data word is transmitted on bus 415 (Step 640) either from package processor 412 (i.e., during configuration/write operations) or from a selected configuration register (i.e., during read operations). After each data word is transmitted, the word-count value stored in package processor 410 is decremented (Step 650), and control returns to Step 620. The loop formed by Steps 620 through 650 is repeated until a positive (Y) result is obtained in Step 620, at which time control is returned to Step 610 and a new header word is awaited.

Configuration Registers

The following paragraphs describe configuration registers connected to bus 415 in accordance with the embodiment shown in FIG. 4. Because common bus 415 is utilized to transmit both configuration commands and configuration data, an almost unlimited number of registers can be connected to bus 415. Therefore, the following list is not intended to be exhaustive.

Command Register

Configuration operation commands are loaded from the bit stream into command register 420 via bus 415 to control the operation of the configuration state machine 470. Each configuration command is identified by a predefined binary code (the opcode). The configuration command stored in command register 420 is executed on the next clock cycle after it is transmitted from packet processor 412. Examples of commands and their effect on configuration circuit 122 are discussed in the following paragraphs. Of course, because each command is identified by a binary code, an almost unlimited number of specialized commands can be controlled through command register 420 from the bit stream.

A write configuration data command is loaded into command register 420 prior to writing configuration data to frame data input register 452 of FDR 450. This command causes configuration state machine 470 to cycle through a sequence of states that control the shifting of FDR 450 and the writing of the configuration data into memory array 125.

When operation of FPGA 100 is suspended, a last frame command is loaded into command register 420 prior to writing a last data frame of a configuration operation. As discussed below, when operation of FPGA 100 is suspended, a special global high (G-High) signal is utilized to prevent signal contention. The last frame command is not necessary when, for example, partial reconfiguration is performed without suspending operation of FPGA 100 (i.e., the G-High signal is not asserted). The last frame command allows overlap of the last frame write operation with the release of the G-High signal.

A read configuration data command is loaded into command register 420 prior to reading frame data from frame data output register 457 of FDR 450. This command is similar to the write configuration data command in its effect on FDR 450.

A begin start-up sequence command is loaded into command register 420 to initiate the start-up sequence. This command is also used to start a shutdown sequence prior to some partial reconfiguration operations. The start-up sequence begins with the next successful CRC check (see CRC register 435, discussed below).

A reset command is loaded into command register 420 to reset, for example, CRC register 435 in the event of an error condition. This command is used mainly for testing or troubleshooting.

An assert G-high signal command is used prior to configuration or reconfiguration operations to prevent signal contention while writing new configuration data. In response to the assert G-High signal command, all CLBs of FPGA 100 are controlled to generate high signals at their output terminals (i.e., onto the interconnect lines 152; see FIG. 2A).

A switch configuration clock (CCLK) frequency command is used to change the frequency of the master CCLK. The new frequency is specified in configuration option data written to configuration options register (COR) 430 (discussed below) prior to executing the switch configuration clock frequency command.

Examples of other commands utilized in command register 420 are provided in the Virtex™ Configuration Architecture Advanced Users' Guide, Application Note number XAPP 151 (Jul. 27, 1999) (Version 1.1), which is available on the web at http://www.xilinx.com, and is incorporated herein by reference. Alternatively, a copy of this application note can be obtained from Xilinx, Inc. at 2100 Logic Drive, San Jose, Calif.

Global Control Register

Global control register 425 stores control data received from the bit stream that controls internal functions of FPGA 100, and operates in conjunction with configuration option data written to configuration options register 430 (discussed below). Examples of control option fields within global control register 425 and their effect on configuration circuit 122 are discussed in the following paragraphs. Of course, because each control option is identified by a binary code, an almost unlimited number of specialized functions can be controlled through global control register 425 from the bit stream. Therefore, the following list is not intended to be exhaustive.

A persist control option causes dual-purpose pins 128 (see FIGS. 2A and 4) to retain their connection with configuration circuit 122 even after initial configuration of FPGA 100 is completed. When the persist control data loaded into global control register 425 is in its default setting, then all dual-purpose pins 128 become user I/O (i.e., connected to logic plane 150) after configuration. Note that dedicated configuration pins 127 (i.e., CCLK, PROG, DONE, and mode control pins M0, M1 and M2) are not affected by the persist control option. In addition, the persist control option does not affect Boundary Scan operations through JTAG circuit 130.

A security control option selectively restricts access to configuration and read operations. If the persist control option (discussed above) is not utilized, then dual-access pins 128 are not available after configuration; however, the Boundary Scan pins 133 are always active and have access to configuration plane 120. To prevent unauthorized access of configuration plane 120 through these pins (or through dual-access pins 128 when the persist control option is selected), security control option data is stored in global control register 425 that controls state machine 470 to selectively disable all read functions from dual-access pins 128 and/or Boundary Scan pins 133.

Mask Register

Mask register 427 is used to prevent undesirable control data signal transmissions from bus 415 to, for example, global control register 425. Mask register 427 stores authorization data that controls switches located between bus 415 and the memory cells of, for example, global control register 425. Each data bit stored by mask register 427 controls an associated switch, thereby controlling the transmission of data to an associated memory cell of global control register 425.

Figure 7A:
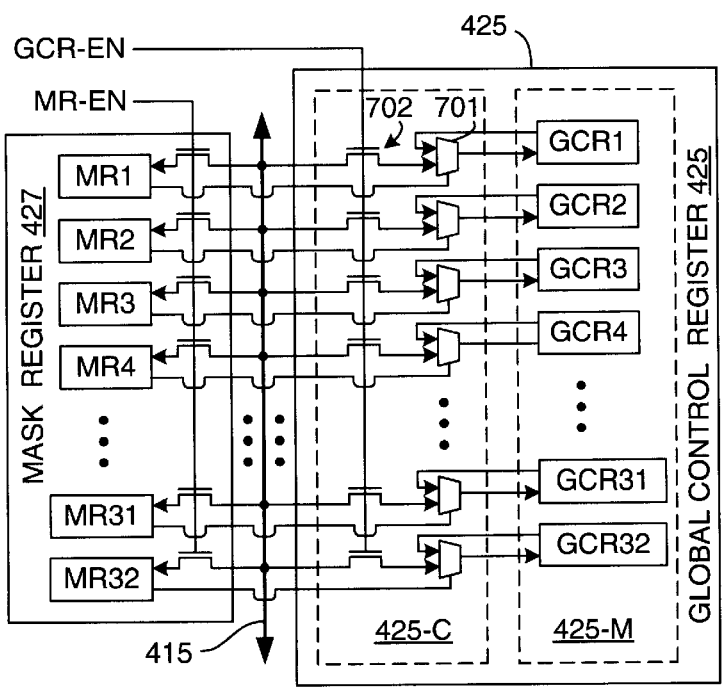
FIG. 7A is a simplified schematic diagram showing a mask register and associated portions of a global control register.

FIG. 7A is a simplified schematic diagram that functionally illustrates the operation of mask register 427. Mask register 427 includes memory cells MR1 through MR32 that store one word from bus 415 in response to a corresponding mask register enable signal MR-EN received from address/operand decoder 414 (see FIG. 5). The data bits loaded into memory cells MR1 through MR32 of mask register 427 are transmitted to an input control section 425-C that is located between bus 415 and memory circuit 425-M of global control register 425. Specifically, the data bit stored in each memory cell MR1 through MR32 of mask register 425 is applied to the select input terminal of an associated two-to-one multiplexer located in input control circuit 425-C. For example, the data bit stored in memory cell MR1 of mask register 427 is applied to the select input terminal of two-to-one multiplexer 701. Each two-to-one multiplexer of input control circuit 701 includes a first input terminal connected to an associated line of bus 415 via a pass transistor, a second input terminal connected to an associated memory cell GCR1 through GCR32 of global control register 425, and an output terminal connected to the associated memory cell. For example, multiplexer 701 has a first input terminal connected to bus 415 via pass transistor 702, a second input terminal connected to an output terminal of memory cell GCR1, and an output terminal connected to an input terminal of memory cell GCR1.

To change the data bit stored in a single selected memory cell of global control register 425, first a 32-bit word is loaded into mask register 427 that writes a logic one to a corresponding memory cell of mask register 427 and logic zeros to all other memory cells. For example, to only change the data bit of memory cell GCR1, a logic one is written to memory cell MR1 and logic zeros are written to memory cells MR2 through MR32. The logic one stored in memory cell MR1 controls multiplexer 701 to pass the signal received at its second (lower) input terminal (i.e., from bus 415), while the logic zeros stored in memory cells MR2 through MR32 control the remaining multiplexers of input control circuit 425-C to feed back the bit values stored in memory cells GCR2 through GCR32. Next, a global control register write enable signal GCR-EN is transmitted by address/operand decoder 414 (see FIG. 5) that turns on all of the pass transistors located between bus 415 and the two-to-one multiplexers of input control circuit 425-C. A second 32-bit word is then transmitted on bus 415 that is applied to the second (lower) input terminals of the multiplexers. Because multiplexer 701 is controlled to pass the bit value from bus 415, this bit value is stored in memory cell GCR1 (i.e., any previously stored value is overwritten). However, because the remaining multiplexers are controlled to feed back the signals from memory cells GCR2 through GCR32, the bit values stored in these memory cells are not changed, even if erroneous bit values are transmitted on associated lines of bus 415. Mask register 427 therefore prevents inadvertent changes to the control data stored in global control register 425.

Configuration Options Register

Configuration options register 430 is used to store configuration options data that is used to control the start-up sequence (discussed below) of FPGA 100 at the end of a configuration operation. Examples of the types of data stored in various fields (i.e., groups of bit locations) of configuration options register 430 and their effect on the start-up sequence are discussed in the following paragraphs. Of course, because each configuration option is identified by a binary code, additional options can be controlled through configuration options register 430. Therefore, the following list is not intended to be exhaustive.

A ConfigRate field of configuration options register 430 stores data bits that control the internally generated frequency of the configuration clock CCLK during some configuration operations.

A StartupClk field of Configuration options register 430 identifies a clock source to synchronize the start-up sequence (discussed below) of FPGA 100. The default is the configuration clock CCLK, which is standard for most configuration schemes. However, in some instances, it is desirable to synchronize the start-up sequence to another clock source.

Configuration options register 430 also includes a group of fields that are used to define which cycles of the start-up sequence will release certain internal signals. For example, a GSR_cycle field stores data that controls the release of a global set/reset (GSR) signal, which is selectively used, for example, to hold all internal CLB flip-flops in their configured initial state. A GTS_cycle field stores data that controls the release of a global tri-state (GTS) signal, which is selectively used to disable all CLB outputs. A GWE_cycle field stores data that controls the release of a global write enable (GWE) signal, which is used to prevent all flip-flops, Block RAM, and LUT memory cells from changing state. A LCK_cycle field stores data that controls which state the start-up sequence maintains until the delay-locked loop (DLL) has established a lock. Finally, a DONE_cycle field stores data that specifies which clock cycle of the start-up sequence releases the DONE pin.

Cyclic Redundancy Check (CRC) Register

Cyclic redundancy check (CRC) register 435 is used to detect errors during the transmission of data/command words to selected registers connected to bus 415. Specifically, using the data transmitted on bus 415, CRC register 435 calculates a check-sum value in accordance with a predetermined equation (described below). At any time during the transmission (e.g., halfway through configuration or at the end of configuration), a pre-calculated check-sum value is transmitted to CRC register 435 that represents an expected check-sum value at the selected time. The pre-calculated check-sum value is then compared with the check-sum value currently stored in CRC register 435. If the pre-calculated check-sum value does not equal the current check-sum value, then an error signal is generated that notifies a user that a transmission error has occurred. Therefore, CRC register 435 facilitates transmission error detection at any time during the transmission of configuration data on bus 415.

Referring to FIG. 5, unlike other registers connected to bus 415, CRC register 435 receives 36 bits each time a data/command is transmitted to a selected register on bus 415. In particular, CRC register 435 receives both the 32-bit data/command word transmitted on bus 415, and the 4-bit register address that is transmitted from packet processor 412 to address/operand decoder 414. By including both register address and bus data in the CRC calculation, CRC register 435 is able to detect both erroneous register designations and erroneous data/command word transmissions. In addition, CRC register 435 receives data bits from bus 415 and the ADDRESS lines in accordance with a CRC register write enable signal CRC-WR-EN, which is generated each time data/commands are written to a selected register(s), or when CRC register 435 is addressed to compare a current check-sum value with a pre-calculated check-sum value. In one embodiment, CRC register write enable signal CRC-WR-EN is generated by OR gate 520, which has input terminals connected to receive the register enable signals of the selected registers and a CRC register enable signal CRC-EN. For example, when R2-EN is high, indicating data/command transmission to register REG2, then OR gate 520 generates a high CRC-WR-EN signal that causes CRC register 435 to receive the data/command words written to register REG2, as well as the 4-bit address transmitted from packet processor 412 on the ADDRESS lines. Alternatively, to compare a current check-sum value, CRC register enable signal CRC-EN is generated by address/operand decoder 414 in response to address signals assigned to CRC register 435, thereby causing OR gate 520 to generate a high CRC-WR-EN signal that causes CRC register 435 to receive 32 bits of the pre-calculated check-sum value from bus 415, as well as the 4-bit address data from address/operand decoder 412.

Figure 7B:
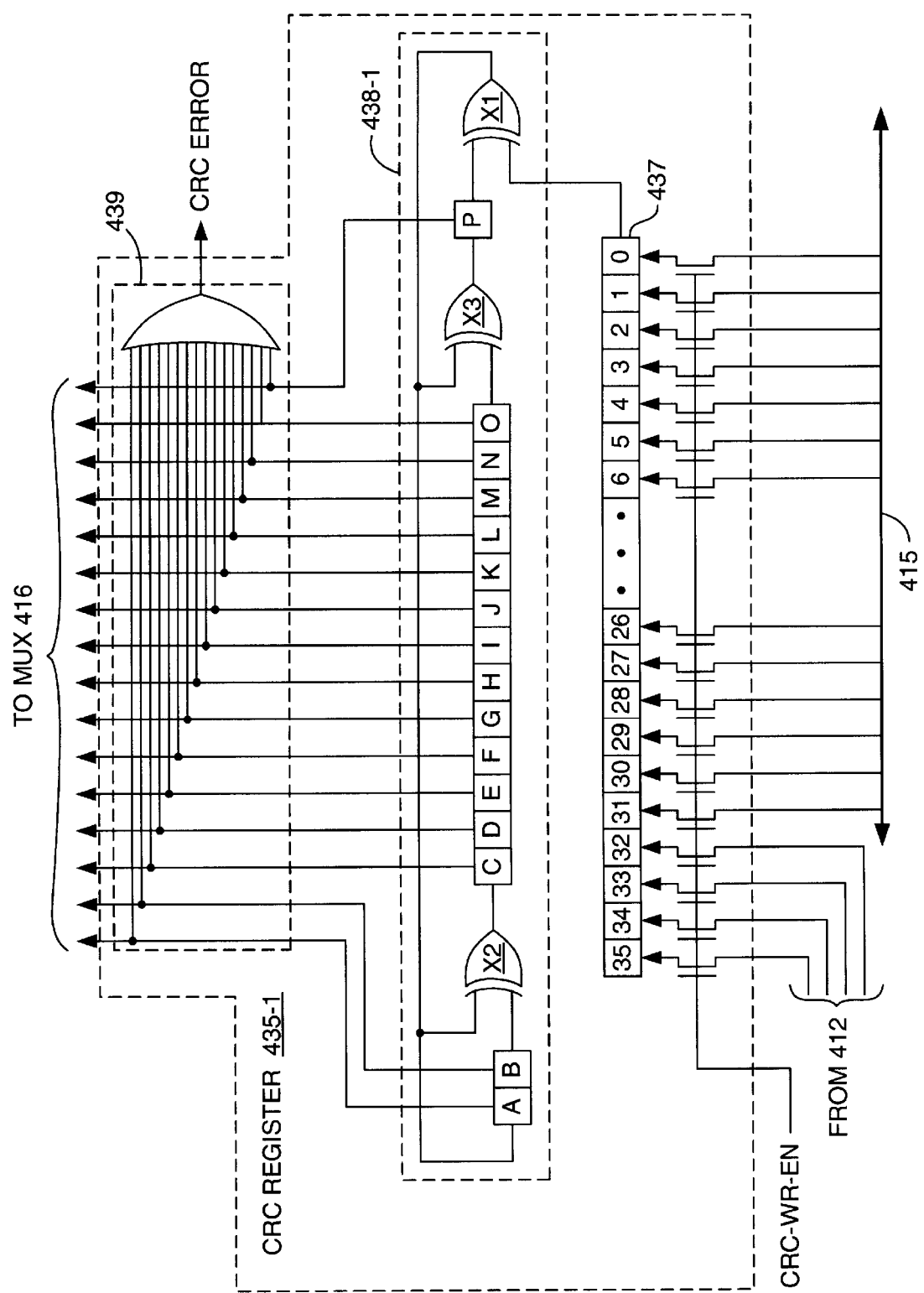
FIG. 7B is a block diagram showing a cyclic redundancy check register according to one embodiment of the present invention.

FIG. 7B is a simplified schematic diagram showing a CRC register 435-1 in accordance with an embodiment of the present invention. CRC register 435-1 includes a 36-bit input register 437, a check-sum calculation section 438-1, and an error signal generation section 439.

Input register 437 includes latches or flip-flops 0 through 35 that store data/command word and address data received from bus 415 and from packet processor 412 in accordance with CRC register write enable signal CRC-WR-EN. The 32 bits transmitted on bus 415 are stored in flip-flops 0 through 31, and the four address bits are stored in flip-flops 32 to 35. Input register 437 then serially shifts the 36 bits from flip-flops 0 through 35 (in ascending order) into check-sum calculation section 438-1.

Check-sum calculation section 438-1 is a sixteen-bit shift register that includes flip-flops A through P and exclusive-OR gates X1, X2 and X3. As data is shifted from input register 437 into check-sum calculation section 438-1, each shifted data value is exclusive-ORed with the bit value stored in flip-flop P, and the results are transmitted to flip-flop A and to input terminals of exclusive-OR gates X2 and X3. At the same time, data is shifted from flip-flop A to flip-flop B, from flip-flop B to exclusive-OR gate X2, and from exclusive-OR gate X2 to flip-flop C. In addition, data values are shifted along flip-flops C through O to exclusive-OR gate X3, and from exclusive-OR gate X3 to flip-flop P.

In this manner, check-sum calculation section 438-1 performs a check-sum algorithm that is based on the following 16-bit polynomial:

$$CRC\text{-}16 = X^{16} + X^{15} + X^2 + 1$$

A current 16-bit check-sum value is calculated in accordance with this polynomial each time the 36 bits stored in flip-flops 0 through 35 are shifted into check-sum calculation section 438-1, and this current check-sum value is stored in flip-flops A through P.

At a selected time (e.g., during or at the end of a configuration operation), the contents of CRC register 435-1 are checked by comparing the current check-sum value with a pre-calculated check-sum value as follows. The pre-calculated check-sum value is written into input register 437 by writing a special header word into packet processor 412 that includes the 4-bit CRC address, thereby causing address/operand decoder 414 to generate a high CRC-EN signal. A subsequently transmitted 32-bit data word is then written from bus 415 into input register 437, along with the 4-bit CRC address from packet processor 412. These 32 bit values are then shifted into check-sum calculation section 438-1. If no transmission errors have occurred (assuming the pre-calculated check-sum value is correct), the resulting values in flip-flops A through P are zero, thereby causing the 16-input OR gate in error signal generation section 439 to generate a low (negative) CRC error signal. Conversely, if a transmission error has occurred, then at least one of memory cells A through P stores a 1, thereby causing the 16-input OR gate in error signal generation section 439 to generate a high CRC error signal.

In the above example, when the current check-sum value stored in flip-flops A through P is "0000000000000000" (i.e., all zeros), a zero bit subsequently shifted into check-sum calculation section 438-1 does not change this all-zero check-sum value. Because an all-zero check-sum value is generated when a pre-calculated check-sum value is identical to a current check-sum value, the most significant sixteen bits of each 32-bit pre-calculated check-sum value written into input register 437 from bus 415 are always zero. For the same reason, CRC register 435 is assigned the 4-bit address "0000".

When transmission errors occur (i.e., the pre-calculated check-sum value does not equal the current check-sum value), it is sometimes desirable to identify the contents of CRC register 435-1 for purposes of determining the cause of the transmission error. For this reason, flip-flops A through P of CRC register 435-1 are applied to read multiplexer 416 (see FIG. 5), which selectively passes these sixteen bit values to bus 415 in response to a "read CRC" header word (i.e., the MUX_CTL signals control read multiplexer 416 to pass the sixteen bit values from flip-flops A through P).

Figure 7C:
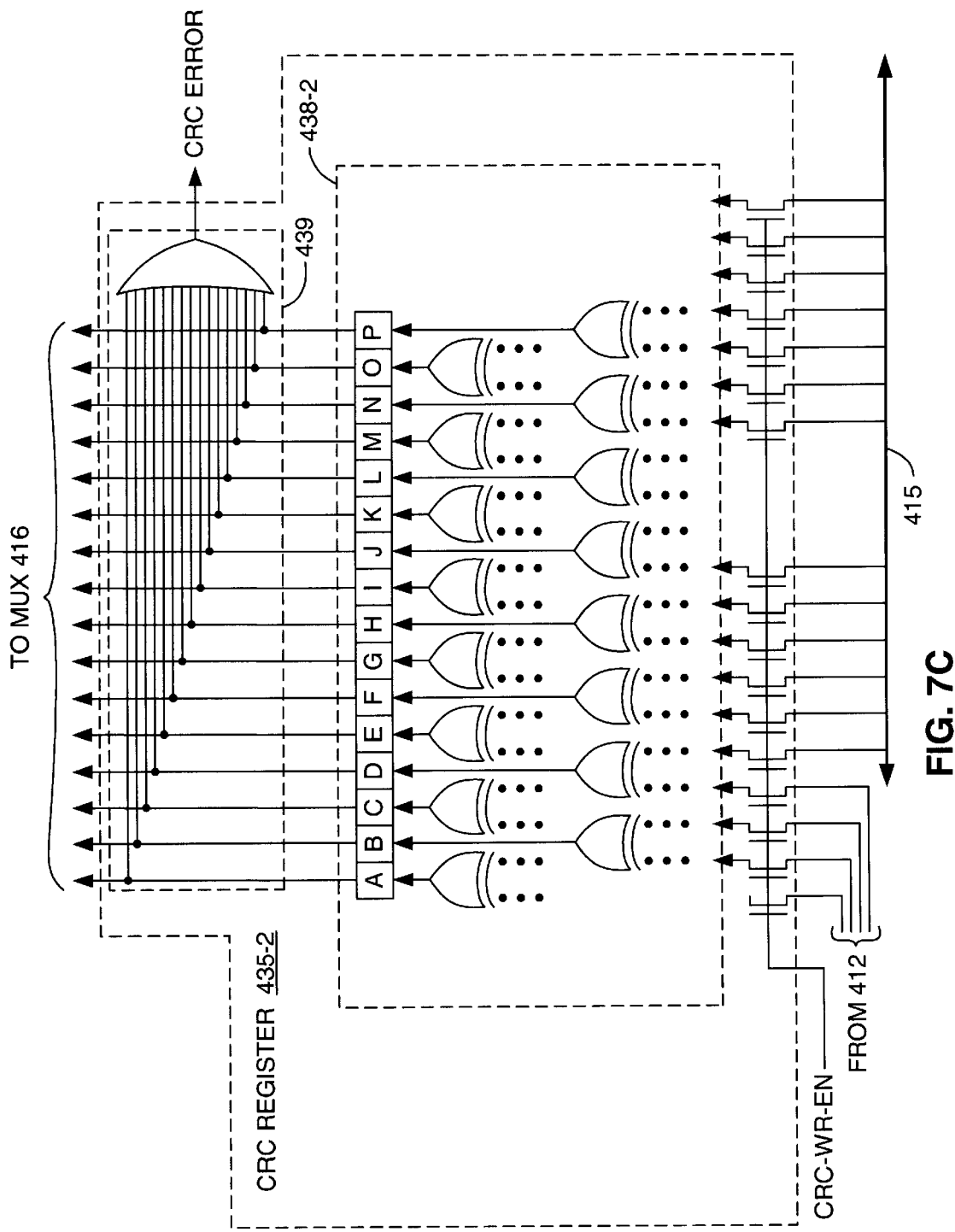
FIG. 7C is a block diagram showing a cyclic redundancy check register according to another embodiment of the present invention.

FIG. 7C is a simplified schematic diagram showing a CRC register 435-2 in accordance with another embodiment of the present invention. Unlike CRC register 435-1, CRC register 435-2 passes the 32 data/command values received from bus 415 and the four address values received from packet processor 412 directly to a check-sum calculation section 438-2 in response to CRC register write enable signal CRC-WR-EN. Although not shown in detail, check-sum calculation section 438-2 includes a series of exclusive-OR gates that are combined using known "Loop Unroll" techniques to form a circuit that performs the 16-bit polynomial (provided above) in a single clock cycle. In contrast to CRC register 435-2, CRC register 435-1 requires 36 clock cycles to shift the bit values from flip-flops 0 through 35 into check-sum calculation section 438-1. Therefore, CRC register 435-2 is significantly faster than CRC register 435-1. The operation of error signal generation section 439 in CRC register 435-2 is identical to that described above with reference to CRC register 435-1.

Although not indicated in FIGS. 7B and 7C, a CRC Reset circuit is provided in CRC register 435 that is responsive to a CRC reset command to change all flip-flops A through P to zero.

Status Register

Status register 437 is loaded with current values of the various control and/or status signals utilized in configuration circuit 122. These signals include the DONE signal that indicates the completion of a configuration operation, the INIT signal that is used to initiate configuration operations, the mode values M0, M1 and M2 that indicate the current configuration mode, and the state of the global control and error signals discussed above. Status register 437 can be read during reconfiguration through general interface circuit 402 or JTAG circuit 130 via bus 415.

Frame Length Register

Frame length register 440 stores data indicating the length of each frame (e.g., the number of 32-bit words in each frame, rounded up to the next highest integer) in memory array 125. The frame length value is transmitted near the beginning of the configuration bit stream, and is used by configuration state machine 470 to provide sequencing information for the configuration read and write operations. Because frame length register 440 stores a frame length value that controls configuration read and write operations, configuration circuit 122 can be incorporated without modification into FPGAs having frames of any length that can be stored in the register.

Frame Address Register/Counter

During configuration operations, frame address register 445 holds the address of the frame being written at a given point in the operation. Similarly, during readback operations, frame address register 445 holds the address of the frame currently being read. The address is divided into four parts that are stored in various fields of frame address register 445. A block type field stores data indicating whether a CLB, IOB or Block RAM frame is being configured or read. A major address field stores the major address of the frame being configured or read, a minor address field stores the minor address of the frame, and a byte field stores the byte being addressed. As discussed above, the major address field indicates the column in which the addressed frame resides, and the minor address field indicates the frame within the column. In one embodiment, the minor address field is incremented each time a full data frame is read from or written to frame data register 450. If the last frame within the CLB column is selected when the increment occurs, the major address field is incremented and the minor address field is reset to zero, otherwise the minor address is incremented.

Frame Data Input Register

Frame data input register 452 makes up a first part of frame data register 450, and is a shift register into which data is loaded prior to transfer to memory array 125. Configuration frame data is written to memory array 125 by loading command register 420 with the write configuration data command, thereby initiating associated operations of state machine 470. A subsequent header word(s) includes the address of frame data input register 452 and the number of 32-bit words to be written into memory array 125. In response to this header word(s), packet processor 412 transmits a register enable signal that enables frame data input register 452 to receive 32-bit configuration frame data words from bus 415. A sequence of 32-bit configuration frame data words are then written to frame data input register 452. As discussed in additional detail below, the write operation is pipelined such that a first frame of data is written to configuration memory array 125 while a second frame is being shifted in. In one embodiment, the last frame (the pad frame) written to memory array 125 includes dummy data that is not actually written to memory cells 126-1 and 126-2.

Frame Data Output Register

Frame data output register 457 makes up a second part of frame data register 450, and is also a shift register into which data is loaded from memory array 125 prior to transfer through bus interface circuit 410 to a selected device pin (i.e., either through general interface circuit 402 or JTAG circuit 130). Frame data output register 457 is used during readback operations. Readback operations are performed by loading command register 420 with the read configuration data command and then addressing frame data output register 457 with a read command.

Multiple Frame Write Register

Multiple frame write register 460 is provided for instances when a common data frame is written into two or more frames of memory array 125. As described in additional detail below, once a data frame is written into a shift register of memory array 125, the data frame can be sequentially written to multiple frames by sequentially changing the frame address transmitted to frame address register 445. In one embodiment, multiple frame write register 460 is a not a physical device, but is provided a "dummy" address. When multiple frame write register 460 is addressed in the bit stream, the subsequently transmitted data bits are ignored by all registers. However, because fewer clock cycles are typically needed to write the common data frame into memory array than are needed to transmit one frame of data into frame data input register 452, the use of multiple frame write register 460 reduces the amount of data in the configuration bit stream, thereby shortening the configuration process and reducing the possibility of data transmission error.

Daisy Output Register

Daisy Output register 465 is used for selectively daisy chaining the configuration bit stream to other PLDs when a master/slave configuration operation is performed. Data written to daisy output register 465 is serialized and applied to the DOUT pin.

Configuration State Machine

Configuration state machine 470 is provided to execute various functions in response to the command words written to command register 420. Configuration state machine 470 is constructed using well-known techniques to assert predetermined control signals upon entering associated states during the execution of each function. The simplest functions require the assertion of a single control signal for one clock cycle. An example of a simple function is a "start" function that requires only one state in which a signal called "start" is asserted for one clock cycle. This signal indicates to the startup sequence block that the startup sequence should now begin. More complex functions require the sequencing of several control signals over several clock cycles. In addition, the control signals generated by configuration state machine 470 may be combined with input signals from other circuits to perform a designated function. An example of a complex function is a write configuration function that, in one embodiment, requires state machine 470 to switch between three states, control the sequencing of six control signals, and receive six input signals from other circuits to perform the function. These various states and control signals are utilized to coordinate the writing of configuration data into memory array 125, as described below.

Those skilled in the art understand that a state machine can be constructed in many ways to perform a particular function. If a particular function is described in sufficient detail, those skilled in the art can typically produce several state machines that perform the function. Because the various functions performed by state machine 470 are described herein, a detailed description of state machine 470 is not provided.

Configuration Memory Array

Figure 7D:
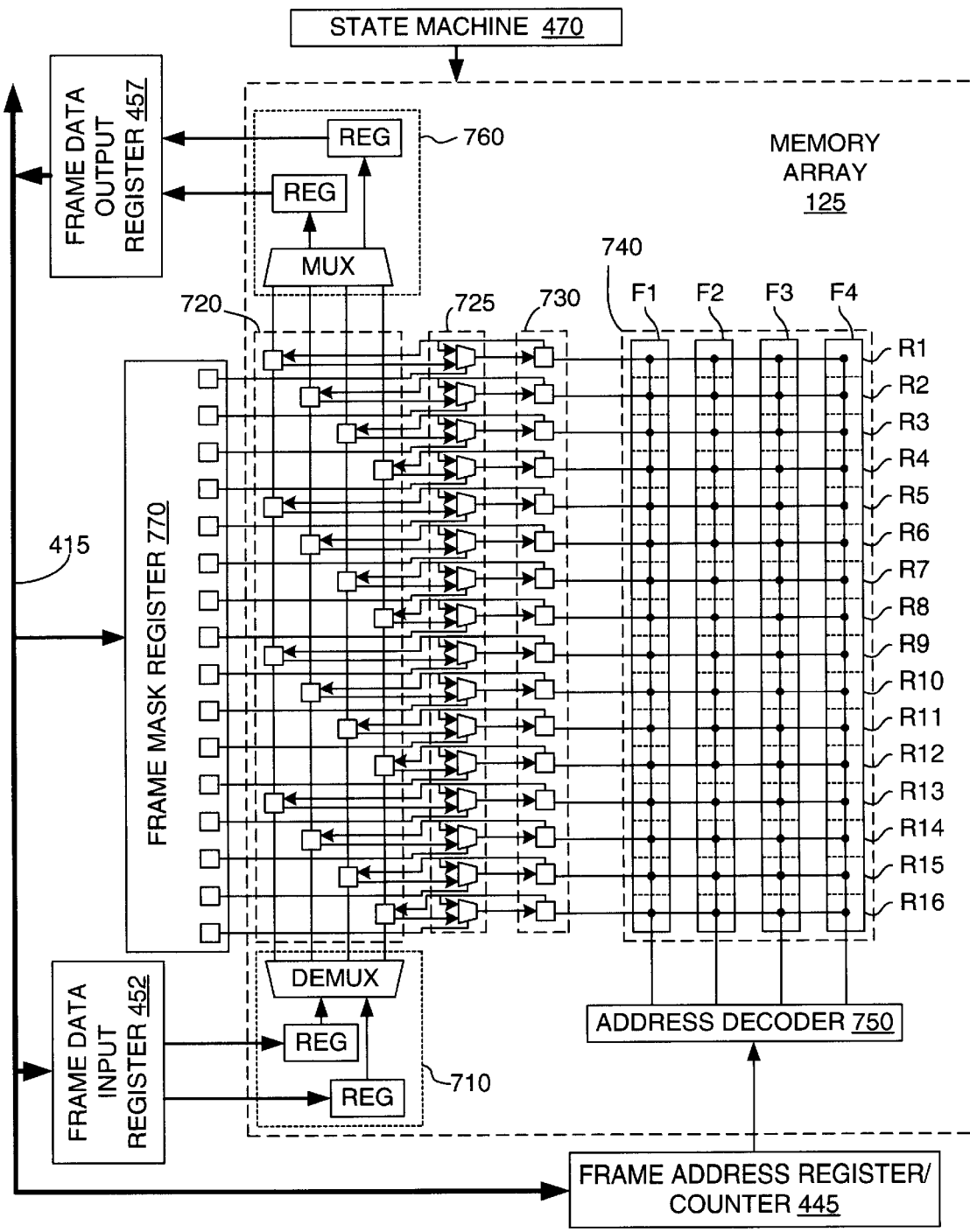
FIG. 7D is a block diagram showing connections between the configuration bus and a memory array of the FPGA shown in FIG. 2A.

FIG. 7D is a block diagram showing configuration memory array 125 in additional detail. Memory array 125 includes an input circuit 710, a shift register 720, an optional multiplexing circuit 725, a shadow register 730, a configuration memory 740, an address decoder 750, and an output circuit 760. Also shown in FIG. 7D is an optional frame mask register 770.

Input circuit 710 converts the configuration data words received from frame data input register 452 into data blocks that are divisible by the number of memory cells in each row of configuration memory 740. For example, when each word contains 32 bits and when each row of configuration memory 740 (discussed below) includes 18 memory cells, then input circuit 710 utilizes multiple registers (REG) to convert the 32 bit words into, for example, 36-bit blocks that are shifted into shift register 720.

Shift register 720 includes a series of flip-flops (indicated by square boxes) that temporarily store the data blocks received from input circuit 710 during configuration (write) operations, and data blocks read from configuration memory 740 during read operations. During configuration operations, shift register 720 transmits entire frames of data to multiplexing circuit 725. During read operations, shift register 720 stores entire frames of data received directly from shadow register 730.

Optional multiplexing circuit 725 operates in cooperation with frame mask register 770 to prevent undesirable data signal transmissions from shift register 720 to configuration memory 740. Frame mask register 770 stores authorization data that is used to control two-to-one multiplexers of multiplexing circuit 725 in a manner similar to that used by mask register 427 (described above). In one embodiment, frame mask register 770 generates one authorization signal for every flip-flop of shadow register 730, and authorization data is shifted into frame mask register 770 from bus 415. In another embodiment (not shown), each authorization signal generated by frame mask register 770 controls a selected group of memory cells of shadow register 730, and authorization data is either received from bus 415 or from frame address register/counter 445. The default setting of frame mask register 770 that is used, for example, during full configuration of configuration memory 740, is to pass all data signals from shift register 720 to shadow register 730. Unless specifically stated otherwise, this default setting is presumed in the following description.

Shadow register 730 includes a series of latches or flip-flops (indicated by square boxes) that are connected by bit lines to frames F1 through F4 of configuration memory 740. (Only four frames are shown in configuration memory 740, for clarity. Actual configuration memories include many more frames.) Shadow register 730 is used, for example, during configuration operations to apply a first frame of data to configuration memory 740 while a second frame is being written into shift register 720.

Configuration memory 740 includes frames arranged in columns (as described above) and rows (e.g., rows R1 through R16). Each row includes a portion of frames F1 through F4 corresponding, for example, to the "height" of one CLB.

Address decoder 750 decodes frame addresses from Frame Address register 445, and transmits corresponding address signals to memory array 740 in accordance with known techniques.

Output circuit 760 converts the memory data blocks received from shift register 720 during readback operations into, for example, 32-bit configuration data words that are then transmitted to frame data output register 457.

Input circuit 710, shift register 720, shadow register 730, address decoder 750, and output circuit 760 are controlled by configuration state machine 470 (discussed above). An embodiment of input circuit 710, shift register 720, shadow register 730, and output circuit 760 is described in U.S. Pat. No. 6,137,307, entitled "STRUCTURE AND METHOD FOR LOADING WIDE FRAMES OF DATA FROM A NARROW INPUT BUS," which is incorporated herein by reference. In another embodiment, the multiplexing functions of input circuit 710 and output circuit 760 are eliminated by utilizing data word lengths that are divisible by the number of memory cells in each row of configuration memory 740.

Configuration Data Processing

Configuration circuit 122 (described above) provides numerous user-controlled parameters and operations that facilitate full or partial configuration of the frames in memory array 125, and readback from both the frames of memory array 125 and from selected configuration registers. These parameters and operations are described in the following examples.

EXAMPLE 1

Full FPGA Configuration

Figure 8:
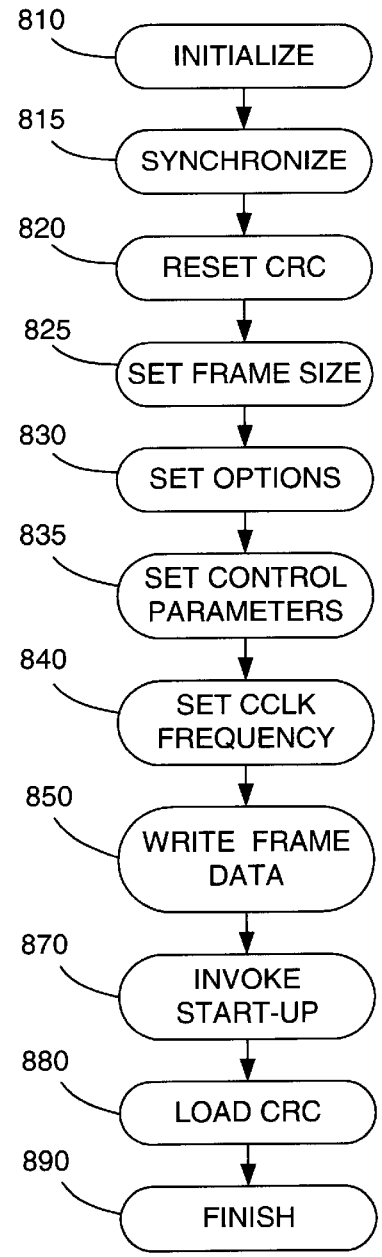
FIG. 8 is a flow diagram showing process steps performed during configuration of the FPGA shown in FIG. 2A.
Figure 9A:
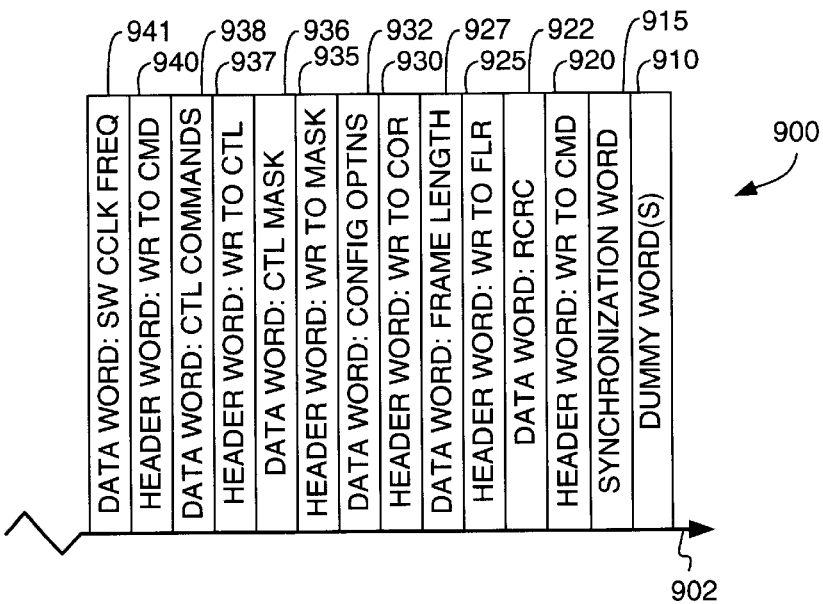
FIGS. 9A and 9B are diagrams depicting the content of a bit stream transmitted to the FPGA during configuration.
Figure 9B:
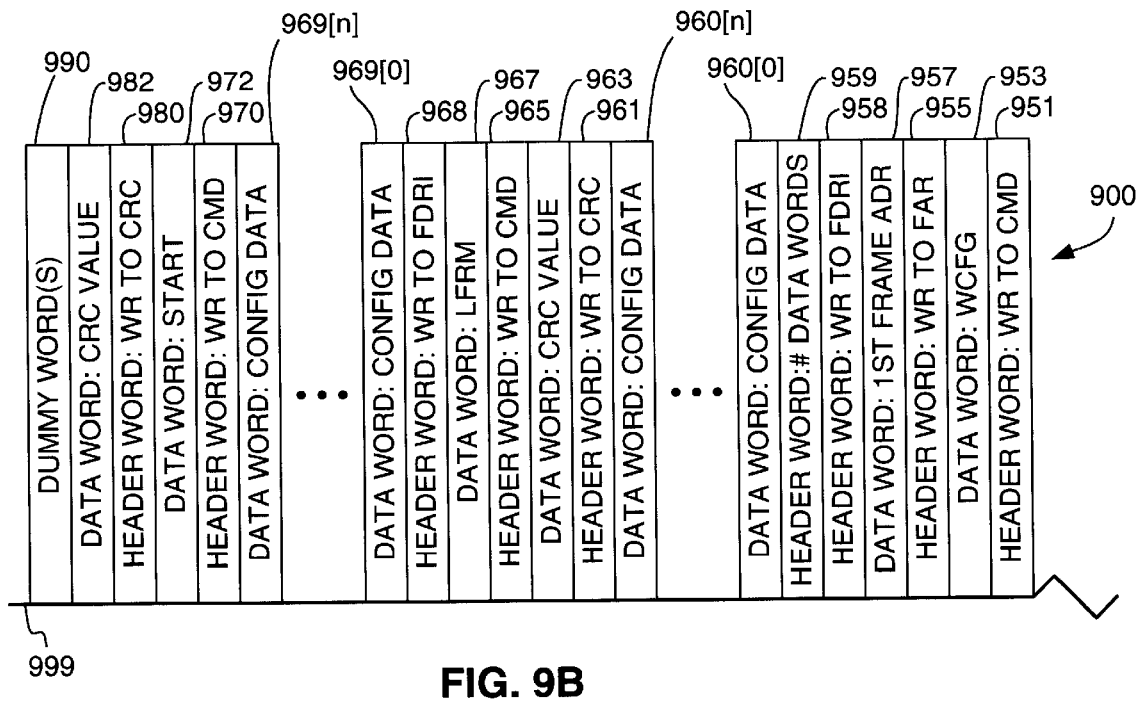

FIG. 8 is a flow diagram illustrating the basic steps associated with a full configuration of memory array 125 of FPGA 100 (see FIG. 2A) in accordance with an embodiment of the present invention. FIGS. 9A and 9B depict a configuration bit stream 900 comprised of 32-bit words that contain configuration data necessary to control configuration circuit 122 (See FIG. 2A) during the configuration operation.

Upon power-up of FPGA 100, configuration circuit 122 is initialized for the loading of data frames from a user's bit stream (Step 810), and then synchronized to the bit stream (Step 815). Referring to FIG. 9A, during initialization, several dummy words 910 (e.g., all 0's) are transmitted to configuration circuit 122 at the beginning 902 of bit stream 900. A synchronization word 915 is transmitted immediately after dummy words 910. Synchronization word 915 sets the 32-bit word boundaries. That is, the first bit after synchronization word 915 is the first bit of the next 32-bit word of bit stream 900. Initialization (Step 810) and synchronization (Step 815) may be eliminated, for example, by constructing configuration circuit 122 to power-up in a known state.

CRC register 435 (see FIG. 4) is then reset (Step 820) by transmitting an appropriate command to command register 420 (see FIG. 4). Referring to FIGS. 8 and 9A, Step 820 is executed by first writing a header word 920 to packet processor 412 (see FIG. 5) indicating a write to command register 420 (WR TO CMD), and then writing a "reset CRC register" (RCRC) command word 922 to command register 420. As discussed above, address/operation decoder 414 (see FIG. 5) generates the appropriate register enable signal that causes command register 420 to receive and store command word 922.

Next, the frame length size of FPGA 100 is loaded into frame length register 440 (Step 825). Referring to FIG. 9A, this step is executed by first writing a header word 925 to packet processor 412 (see FIG. 5) indicating a write to frame length register 440 (WR TO FLR), and then writing a word 927 including the frame length (FRAME LENGTH) value to frame length register 440. Similar to the previous steps, Step 825 may be eliminated by appropriately constructing configuration circuit 122 to automatically recognize the frame length used in FPGA 100. However, as mentioned above, the inclusion of frame length register 440 facilitates the use of configuration circuit 122 in FPGAs having different frame lengths, thereby simplifying the design process of these various FPGAs.

Configuration circuit 122 is then programmed in accordance with a user's preferences by commands and options transmitted in bit stream 900. Referring to FIG. 8, in the disclosed example this programming process is performed by setting configuration options (e.g., StartupClk, GSR_cycle, GTS_cycle, GWE_cycle, LCK_cycle and DONE_cycle, described above) (Step 830), setting control parameters (Step 835), and then setting the configuration clock frequency (ConfigRate field) (Step 840). Referring to FIG. 9A, Step 830 is executed by first writing a header word 930 to packet processor 412 indicating a write to configuration options register 430 (WR TO COR), and then writing a word 932 including the desired configuration option values (CONFIG OPTIONS) to configuration options register 430. Step 835 is executed by first writing a header word 935 to packet processor 412 indicating a write to mask register 427 (WR TO MASK), writing an appropriate control-mask (CTL MASK) word 936 to mask register 427, then writing a header word 937 indicating a write to global control register 425 (WR TO CTL), and finally writing a control command word 938 including the desired control command data (CTL COMMANDS) to global control register 425. Finally, Step 840 is partially executed by the configuration data previously written to configuration options register 430, and then initiated by executing a switch configuration clock frequency command in command register 420. This command is executed by first writing a header word 940 to packet processor 412 indicating a write to command register 420, and then writing the switch configuration clock frequency (SW CCLK FREQ) command word 941 to command register 420. The order in which programming Steps 830, 835 and 840 is performed is determined by configuration circuit 122, and may be changed with an associated change to configuration circuit 122. For example, because the configuration clock frequency is stored by configuration options register 430 and initiated by a command executed in command register 420, the order of these steps in bit stream 900 is determined by configuration circuit 122.

Similar to the previous steps, programming Steps 830, 835 and 840 may be eliminated by appropriately constructing configuration circuit 122 to automatically operate at predetermined settings. However, such predetermined settings would diminish or eliminate user control of configuration circuit, 122, thereby rendering FPGA 100 less versatile.

Referring again to FIG. 8, after programming of configuration circuit 122 is complete, the configuration process then writes configuration data into the frames of memory array 125 via frame data input register 452 (Step 850). Step 850 is described with reference to FIGS. 7D and 9B.

Referring to FIG. 9B, Step 850 is initiated by first writing a header word 951 to packet processor 412 indicating a write to command register 420 (WR TO CMD), then writing an appropriate configuration (WCFG) command word 953 to command register 420. Configuration command word 953 places configuration state machine 470 in a configuration mode during which configuration state machine 470 transmits a predefined sequence of control signals to memory array 125.

Next, a header word 955 is sent to packet processor 412 indicating a write to frame address register 445 (WR TO FAR), then a first frame address (1ST FRAME ADR) word 957 is transmitted to frame address register/counter 445. Referring to FIG. 7D, first frame address word 957 is used to set an initial address transmitted from frame address register/counter 445 to address decoder 750, thereby causing address decoder 750 to address the first frame (e.g., frame F1) of configuration memory 740.

Referring again to FIG. 9B, the transfer of data words to frame data input register 452 is then initiated using a two-part header. Two-part headers are used when the number of words written to memory array 125 is too large to include in a header word containing address and command data. In the example shown in FIG. 9B, a first header word 958 is written to packet processor 412 that includes the address of frame data input register 452 and a write to frame data input register (WR TO FDRI) instruction. First header word 958 is followed by a second header word 959 that specifies the number of 32-bit data words (# DATA WORDS) that follow in bit stream 900. Configuration data words 960[0:n] are then sequentially transmitted from bus 415 through frame data input register 452 to input circuit 710 (FIG. 7D). As discussed above, input circuit 710 converts the data words into data blocks that are transmitted to shift register 720 under the control of configuration state machine 470. Each time shift register 720 is full (i.e., the number of words 960[0:n] shifted through input circuit 710 into shift register 720 is equal to the number stored in frame length register 440), the contents of shift register 720 are shifted to shadow register 730. The contents of shadow register 730 are then applied, under the control of configuration state machine 470, to the bit lines of configuration memory 740 and into the configuration memory cells of the frame currently addressed by address decoder 750. After each frame is written, configuration state machine 470 causes frame address register/counter 445 to increment, thereby causing address decoder 750 to address a new frame. The process of writing and addressing is repeated until all configuration data words 960[0:n] are written into configuration memory 740.

In accordance with an embodiment, configuration data words 960[0:n] include all data for all but one frame of memory array 125. This last frame of data is written after an initial CRC check-sum value (CRC VALUE) is loaded into CRC register 435 using an appropriate header 961 (WR TO CRC) and data word 963 (CRC VALUE). Another write to command register 420 word 965 (WR TO CMD) is then transmitted along with a last data frame (LFRM) command 967. Last data frame command 967 notifies configuration state machine 470 that a final series of words is about to be sent to frame data input register 452. Finally, another write to frame data input register (WR TO FDRI) header 968 is written to packet processor 412, followed by the final series of configuration data words 969[0:n] that are written to frame data input register 452. Note that the number of data words in the final frame is small enough to be transmitted in header word 968, so a two-part header is not needed for the final series of configuration data words 969[0:n].

Referring again to FIG. 8, after the last frame is written into configuration memory 740, the configuration process ends with an invoke device start-up command (Step 870) and a final CRC check (Step 880). FIG. 9B includes the series of words used to invoke a device start-up routine and to perform a final CRC check. This series of commands includes a header 970 (WR TO CMD) indicating a subsequent start-up (START) command 972 written to command register 420, followed by a header 980 (WR TO CRC) indicating the transmission of a final CRC value word 982 written to CRC register 435 including a pre-calculated check-sum value. Optional dummy words 990 are then transmitted at the end 999 of bit stream 900 to provide time for the device start-up sequence. If the final CRC check produces positive results, then logic plane 150 (see FIG. 2A) is enabled using global signals (e.g., the GSR signal, the GTS signal, and the GWE signal, all discussed above) in a sequence determined in part by the data stored in configuration options register 430. When these signals are asserted, the configuration of FPGA 100 is complete (Step 890, FIG. 8) and logic plane 150 is operational.

EXAMPLE 2

Full FPGA Readback

Readback is the process of reading out the frame data stored in memory array 125 (see FIG. 2A) through frame data output register 457 (see FIG. 4). This frame data is transmitted in the form of a readback bit stream that can be used to verify that the configuration data stored in configuration memory array 125 is correct, and to read the current state of all internal CLB and IOB registers as well as current LUT RAM and Block RAM values. Readback is typically performed after FPGA 100 is operational (i.e., logic plane 150 is operating). Therefore, command and readback bit streams are transmitted either through JTAG circuit 130 (see FIGS. 2A and 4), or through one or more dual-purpose I/O pins 128. Note that the persist configuration option (discussed above) must be enabled to facilitate readback through dual-purpose I/O pins 128. In one embodiment, readback operations are only permitted in an 8-bit parallel manner (i.e., via eight dual-purpose I/O pins 128). Therefore, appropriate persist configuration option settings must be entered into configuration options register 430 before a readback operation can be executed.

Figure 10:
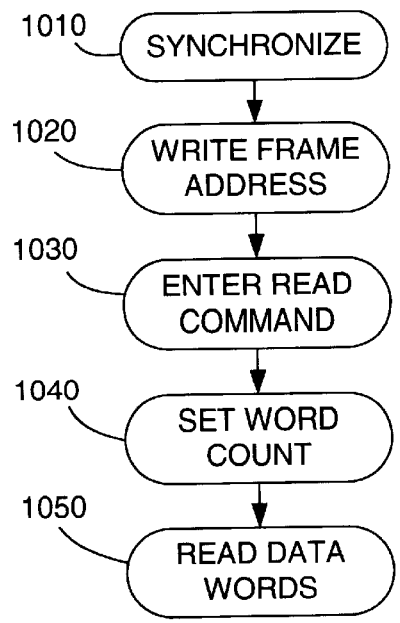
FIG. 10 is a flow diagram showing process steps performed during a readback operation.
Figure 11:
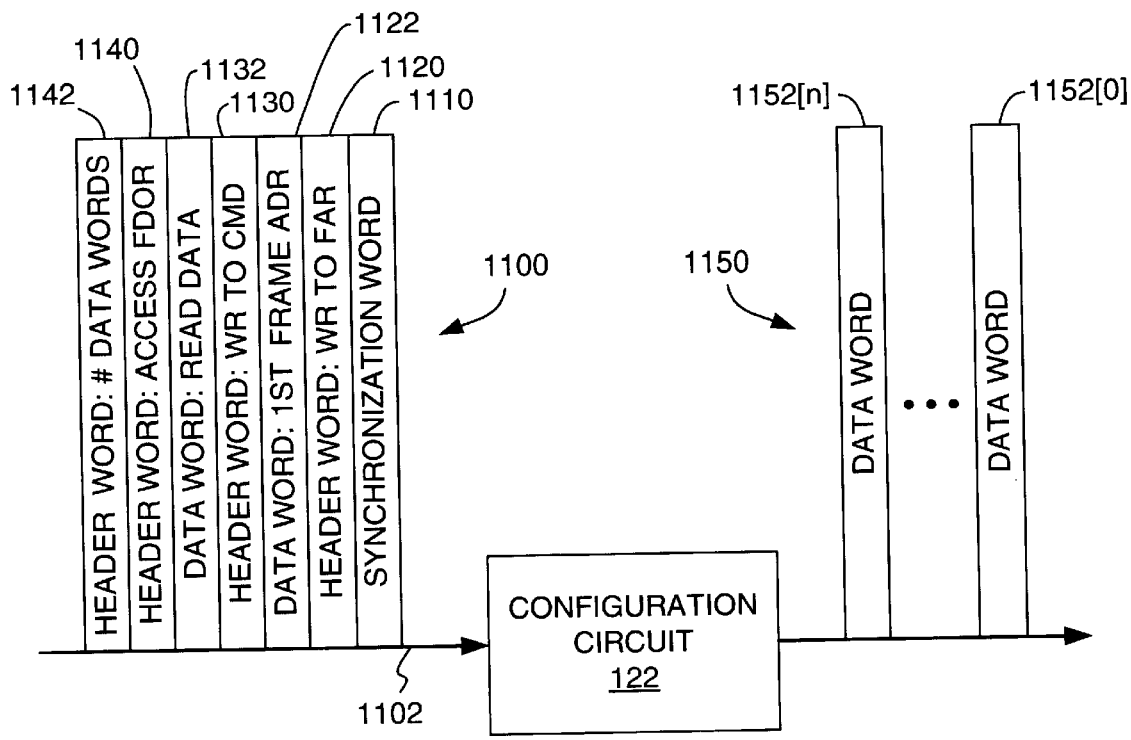
FIG. 11 is a diagram depicting the content of bit streams transmitted to and from the FPGA during the readback operation.

FIG. 10 is a flow diagram illustrating the basic steps associated with a full readback of memory array 125 of FPGA 100 (see FIG. 2A) in accordance with an embodiment of the present invention. FIG. 11 depicts a command bit stream 1100 comprised of 32-bit words that contain commands necessary to cause configuration circuit 122 to generate a readback bit stream 1150 containing frame data from memory array 125.

Referring to FIG. 10, configuration circuit 122 is first synchronized to command bit stream 1100 (Step 1010) using a synchronization word 1110 (FIG. 11) that is transmitted at the beginning 1102 of command bit stream 1100. Similar to synchronization word 915 (discussed above), synchronization word 1110 sets the 32-bit word boundaries in configuration circuit 122 for processing the subsequent words of command bit stream 1100. Synchronization word 1110 may be omitted if configuration circuit 122 is already synchronized.

Once configuration circuit 122 is synchronized, the address of the first frame to be read back is written into frame address register 445 (Step 1020, FIG. 10). Referring to command bit stream 1100 (FIG. 11) and to FIG. 5, this step is performed by sending a header word 1120 to packet processor 412 indicating a write to frame address register 445 (WR TO FAR), then a first frame address (1ST FRAME ADR) word 1122 is transmitted to frame address register 445. Referring to FIG. 7D, frame address, register 445 causes address decoder 750 to address the first frame (e.g., frame F1) of configuration memory 740 in accordance with first frame address word 1122.

Referring again to FIG. 10, the next step of the readback process includes entering a "read" command into command register 420 (Step 1030). As shown in FIG. 11 (with reference to FIGS. 4 and 5), this step includes writing a header word 1130 to packet processor 412 indicating a write to command register 420 (WR TO CMD), then writing an appropriate read configuration data (READ DATA) command word 1132 to command register 420.

Referring again to FIG. 10, the number of words to be read is then transmitted in a two-part header to packet processor 412 (Step 1040). As shown in FIG. 11, this step is performed using a first header word 1140 that addresses frame data output register 457 and includes a read instruction (ACCESS FDOR), followed by a second header word 1142 that specifies the number of 32-bit data words (# DATA WORDS) to be read from memory array 125. Note that a single-word header can be used to initiate this readback step if the number of data words read from memory array 125 is sufficiently small.

In response to command bit stream 1100, a readback bit stream is generated by memory array 122 (Step 1050, FIG. 10). Referring to FIG. 7D, in response to the frame currently addressed by address decoder 750, the first frame of configuration data is transmitted to shadow register 730, from which it is transferred to shift register 720. This first data frame is then converted into 32-bit words by output circuit 760 in a manner similar to that utilized by input circuit 710 (discussed above). As these 32-bit words are generated, they are passed to frame data output register 457, which transmits the 32-bit parallel words onto bus 415. Referring to FIG. 5, the 32-bit parallel words pass through read multiplexer 416 and tri-state buffer 418 to the D2 data terminal of packet processor 412. Packet processor 412 then transmits the 32-bit data words either to the TDO pin of JTAG circuit 130, or to one or more dual-purpose I/O pins 128 associated with general interface circuit 402. As indicated in FIG. 11, these data words form data frames 1152[0:n] of readback bit stream 1150 that are transmitted, for example, to a central processing unit (not shown) that is used (for example) to compare readback bit stream 1150 with a stored data file.

EXAMPLE 3

Capture

Capture is used to identify the states of all flip-flops (registers) of FPGA 100. A capture operation can be used, for example, for hardware debugging and functional verification.

Figure 12:
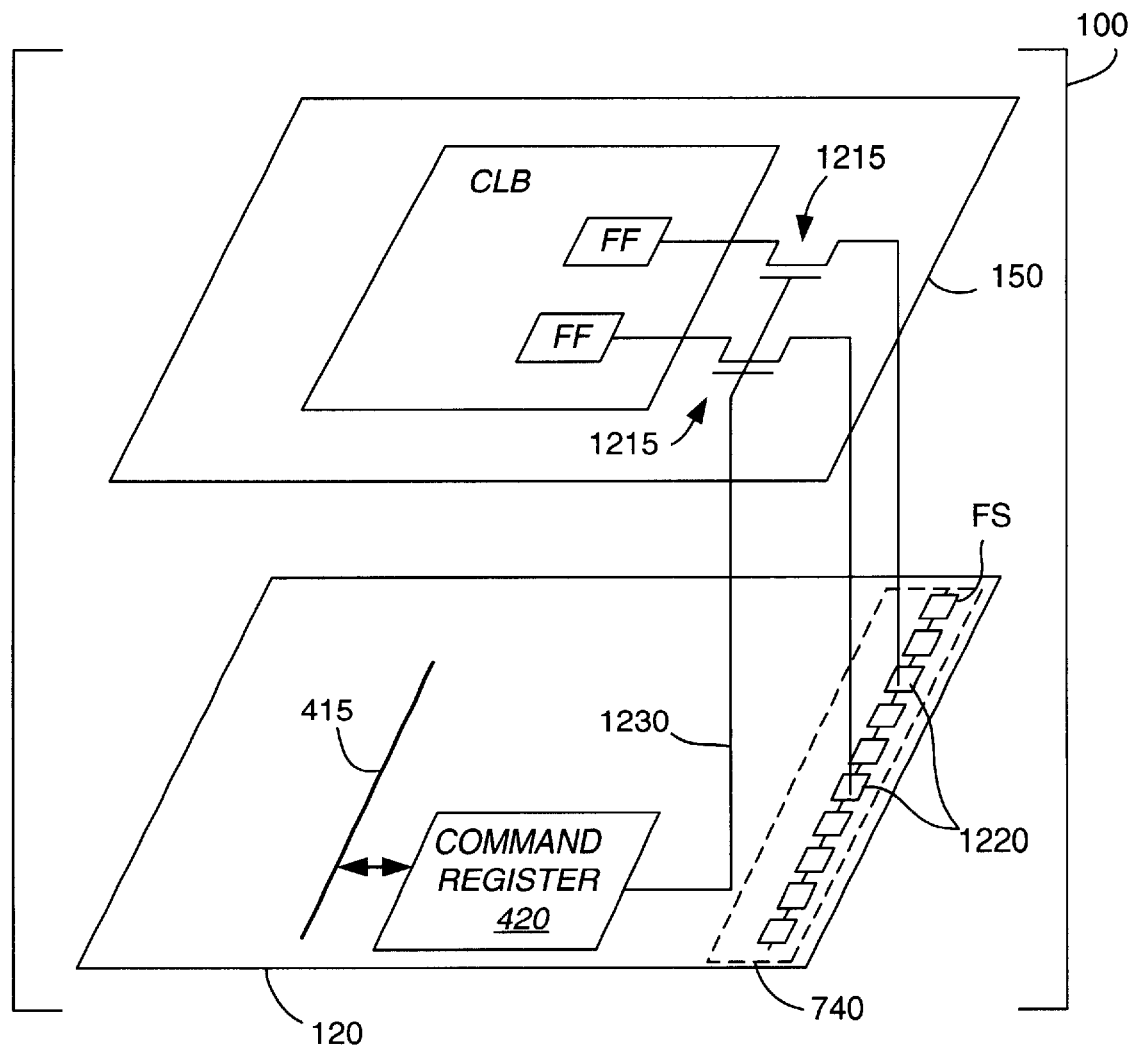
FIG. 12 is a simplified diagram illustrating a data capture circuit of the FPGA shown in FIG. 2A.

FIG. 12 is a partial exploded view illustrating a portion of FPGA 100. Each CLB and IOB of FPGA 100 includes one or more flip-flops (FF) that store state information generated during operation of logic plane 150. In accordance with another aspect of the present invention, each flip-flop of FPGA 100 is connected via a capture transistor 1215 to a corresponding memory cell 1220 that is located in one or more special frames FS of configuration memory 740 (see FIG. 7D). The gates of capture transistors 1215 are connected to a line 1230 that is controlled by command register 420.

Figure 13:
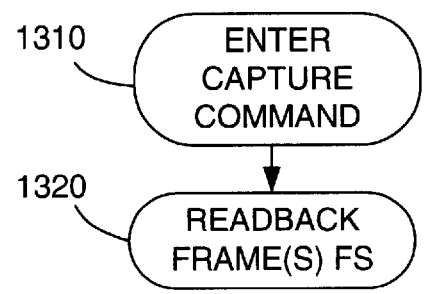
FIG. 13 is a flow diagram showing process steps performed during a data capture operation.

FIG. 13 is a flow diagram showing the basic steps associated with a capture operation. Utilizing the methods described above, the capture command is loaded into command register 420 (Step 1310), thereby causing command register 420 to generate a high signal on line 1230. This high signal turns on capture transistors 1215, thereby writing the contents of all flip-flops (registers) of FPGA 100 into special frame(s) FS of configuration memory 740. After special frame(s) FS are written, a partial readback operation is performed (Step 1320) in accordance with the readback operation process described above (i.e., with the address of special frames(s) FS transmitted to frame address register 445, and a corresponding word count value sent to frame data output register 457).

EXAMPLE 4

Read-Modify-Write

In accordance with another aspect of the present invention, configuration circuit 122 enables selected memory cells of a frame to be written while logic plane 150 of FPGA 100 is operating in a user's system. These functions are described below with reference to a "read-modify-write" operation during which selected data bit values associated with one frame are modified through configuration circuit 122 during operation of logic plane 150.

Referring to FIG. 14, the "read-modify-write" operation of the present example is used in a system including FPGA 100 and an embedded microprocessor 1410. Microprocessor 1410 performs operating tasks that run in parallel with a user's system. Microprocessor 1410 communicates with configuration circuit (CFG CKT) 122 through one or more dual-purpose IOBs in the manner discussed above. Alternatively, microprocessor 1410 may communicate with configuration circuit (CFG CKT) 122 through JTAG circuit 130 (as indicated by the dashed line).

As discussed above, FPGA 100 includes CLBs, IOBs and interconnect resources whose operations in logic plane 150 are controlled by user-defined configuration data stored in memory array 125 of configuration plane 120. In the present example, LUTs F and G of a particular CLB (i.e., CLB 1420) are used to implement a portion of the user's logic function. For simplicity, only LUTs F and G are shown in FIG. 14; the logic plane circuitry of FPGA 100, other than LUTs F and G of CLB 1420, are referred to as user logic design (USER LOGIC) 1430 that communicates with other portions of the system (not shown) through independent IOBs (i.e., different from those used by configuration circuit 122). In addition, only portions of the frames of memory array 125 that store configuration data for LUTs F and G are indicated in FIG. 14. Finally, the I/O pins of FPGA 100 utilized to provide connections between user logic design 1430 and other ICs of the system are shown only as IOB 1440.

In accordance with the present example, data bit values stored in memory location 15 of both LUTs F and G are modified during execution of the user's logic function using a "read-modify-write" operation. As indicated in FIG. 14, these data bit values are stored in memory cells M15,4 and M15,7 of frame F15 in memory array 125. It is assumed that other data bit values of frame F15 are known. Therefore, the "read-modify-write" operation must change only the data bit values of memory cells M15,4 and M15,7 without disturbing the data bit values in the other memory cells of frame F15.

FIG. 15 is a simplified flow diagram illustrating the steps associated with the "read-modify-write" operation during which new data bit values are written into memory cells M15,4 and M15,7 (FIG. 14). The "read-modify-write" operation is described with reference to FIG. 7D.

The process begins by writing mask data into frame mask register 770 (Step 1510). In one embodiment, this step is performed in a manner similar to that described above with respect to writing one frame of data into frame data input register 452. Specifically, after transmitting an appropriate command to command register 420 (FIG. 4) and addressing frame mask register 770, 32-bit mask data words are transmitted on bus 415 to frame mask register 770 until an entire frame of mask data is stored in mask register 770. Because the mask data transmitted to frame mask register 770 is subsequently used to control multiplexing circuit 725 to pass data from shift register 720 only to two memory locations in shadow register 730, the data bit values for these two memory locations are different from all other mask data bit values. For example, in accordance with the mask data, a logic 1 is stored in the flip-flops of frame mask register 770 corresponding to the fourth and seventh memory cells of shadow register 730, and a logic 0 is stored in all other flip-flops of frame mask register 770.

Next, data bit values stored in frame F15 are read into shadow register 730 (Step 1520). This step is performed in a manner similar to that described above with reference to readback operations. However, instead of fully shifting the data bit values of frame F15 onto bus 415 through shift register 720 and frame data output register 457, the data bit values of frame F15 are held in shadow register 730.

Next, a bit stream including the new data bit values for memory cells M15,4 and M15,7 is transmitted via bus 415 into shift register 720 (Step 1530). This step is performed in a manner similar to corresponding portions of a configuration write operation (described above). Note that data bit values other than the new data bit values for memory cells M15,4 and M15,7 may have random (i.e., "don't care") values.

The contents of shadow register 730 are then modified to store the new data bit values from shift register 720 under the control of frame mask register 770 (Step 1540). As described above, frame mask register 770 controls data transmissions from shift register 720 into shadow register 730 by controlling multiplexing circuit 725. For example, the logic 1 stored in the flip-flops of frame mask register 770 corresponding to the fourth and seventh memory cells of shadow register 730 cause multiplexing circuit 725 to pass the new data bit values from shift register 720 into corresponding flip-flops of shadow register 730, thereby overwriting previous data bit values associated with memory locations 15 of LUTs F and G. Conversely, the logic 0 stored in all other flip-flops of frame mask register 770 cause multiplexing circuit 725 to feed back previously-stored data bit values into corresponding flip-flops of shadow register 730, thereby preserving these "old" data bit values of frame F15.

Finally, the contents of shadow register 720 are transferred back into the memory cells of frame F15 (Step 1550). This step is performed in a manner similar to corresponding portions of a configuration write operation (described above). Note again that only memory cells M15,4 and M15,7 are modified by data bit values transmitted in the bit stream on bus 415. All other memory cells of frame F15 retain their original state, thereby avoiding potentially undesirable reconfiguration of these other memory cells.

Note that the order of some steps illustrated in FIG. 15 may be changed without affecting the "read-modify-write" operation. For example, the steps of writing mask data (Step 1510), reading frame data into shadow register 730 (Step 1520), and writing new data into shift register 720 (Step 1530) may be performed in any order, provided all three steps are performed before data bit values in shadow register 730 are modified (Step 1540).

The above examples illustrate a few of the functions that can be performed using the configuration bus structure disclosed herein. Those having skill in the relevant arts of the invention will now perceive various modifications and additions that may be made as a result of the disclosure herein. Accordingly, all such modifications and additions are deemed to be within the scope of the invention, which is to be limited only by the appended claims and their equivalents.

What is claimed is:

1. A programmable logic device (PLD), comprising:
   a first external interface circuit for receiving first configuration data;
   a second external interface circuit for receiving second configuration data;
   a configuration memory array for storing the first configuration data and the second configuration data;
   a plurality of configurable logic circuits for performing a logic function in accordance with the first and second configuration data stored in the configuration memory array; and
   a bus interface circuit connected between the first and second external interface circuits and the configuration memory array, the bus interface circuit including a switch for passing one of the first configuration data and the second configuration data between a selected one of the first and second external interface circuits and the configuration memory array.

2. The programmable logic device of claim 1, wherein the switch is selectively controlled to pass the first configuration data to the configuration memory array during a first configuration mode, and to pass the second configuration data to the configuration memory array during a second configuration mode.

3. The PLD of claim 1, wherein the first external interface circuit receives the first configuration data in serial format.

4. The PLD of claim 1, wherein the second external interface circuit receives the second configuration data in parallel format.

5. The PLD of claim 4, wherein the first external interface circuit receives the first configuration data in serial format.

6. A programmable logic device (PLD), comprising:
   a first interface circuit coupled to receive first configuration data from a first source external to the PLD;
   a second interface circuit coupled to receive second configuration data from a second source external to the PLD;
   a configuration memory array;
   a programmable logic circuit having programmable functions controlled by stored data received from the configuration memory array; and
   a bus interface circuit coupled between the first interface circuit and the configuration memory array, and further coupled between the second interface circuit and the configuration memory array, the bus interface circuit being configurable to provide one of the first configuration data and the second configuration data from a selected one of the first and second interface circuits to the configuration memory array.

7. The PLD of claim 6, wherein the bus interface circuit is selectively configured to pass the first configuration data to the configuration memory array during a first configuration mode, and to pass the second configuration data to the configuration memory array during a second configuration mode.

8. The PLD of claim 6, wherein the first source external to the PLD is a JTAG circuit.

9. The PLD of claim 6, wherein the first interface circuit is coupled to receive serial configuration data.

10. The PLD of claim 6, wherein the second interface circuit is coupled to receive parallel configuration data.

11. The PLD of claim 10, wherein the first interface circuit is coupled to receive serial configuration data.

12. The PLD of claim 11, wherein the first source external to the PLD is a JTAG circuit.

13. A programmable logic device comprising:

means for receiving first configuration data;

means for receiving second configuration data;

means for storing the first configuration data and the second configuration data;

means for performing a logic function in accordance with the first and second configuration data stored in the means for storing; and a bus interface circuit connected between the first and second means for receiving and the means for storing, the bus interface circuit including a switch for passing one of the first configuration data and the second configuration data between a selected one of the first and second means for receiving and the means for storing.

* * * * *